(12) United States Patent
Giuroiu

(10) Patent No.: US 6,806,765 B2
(45) Date of Patent: Oct. 19, 2004

(54) METHOD AND APPARATUS FOR CHECKING THE RESPONSE OF A TRANSCONDUCTANCE- CAPACITANCE FILTER

(75) Inventor: Horia Giuroiu, Campbell, CA (US)

(73) Assignee: Oki America, Inc., Sunnyvale, CA (US)

( * ) Notice: Subject to any disclaimer, the term of this patent is extended or adjusted under 35 U.S.C. 154(b) by 33 days.

(21) Appl. No.: 10/201,698

(22) Filed: Jul. 24, 2002

(65) Prior Publication Data

US 2004/0017250 A1 Jan. 29, 2004

(51) Int. Cl.[7] ................................................ H03K 5/00
(52) U.S. Cl. ...................................... 327/553; 327/552
(58) Field of Search ................................ 327/336, 339, 327/552, 553, 554, 558, 103, 555, 556, 557

(56) References Cited

U.S. PATENT DOCUMENTS

| | | | | |
|---|---|---|---|---|
| 4,509,019 A | * | 4/1985 | Banu et al. | 330/107 |
| 5,625,317 A | * | 4/1997 | Deveirman | 327/553 |
| 5,982,228 A | | 11/1999 | Khorramabadi et al. | 327/553 |
| 6,466,090 B1 | * | 10/2002 | Giuroiu | 330/86 |
| 6,512,414 B2 | * | 1/2003 | Yokoyama et al. | 327/553 |

OTHER PUBLICATIONS

Chao–Sun Pang, "Measure Your Filter's Characteristics", Test & Measurement World, Apr. 1, 1999, pp. 1–4.

Hiroshi Yamazaki et al., "A 450kHz CMOS Gm–C Bandpass Filter with ±0.5% Center Frequency Accuracy for On–Chip PDC IF Receivers", ISSCC Digest of Technical Papers, 1999, pp. 392–393.

Shanthi Pavan et al., "Time–Scaled Electrical Networks—Properties and Applications in the Design of Programmable Analog Filters", IEEE Transactions On Circuits and Systems—II, vol. 47, pp. 161–165, Feb. 2000.

Benoit Dufort et al., "Signal Generation Using Periodic Single and Multi–Bit Sigma–Delta Modulated Streams", Proc. IEEE International Test Conference, Washington, D.C., pp. 396–405, Nov. 1997.

Ara Hajjar et al., "A High Speed and Area Efficient On–Chip Analog Waveform Extractor", Proc. IEEE International Test Conference, Washington, D.C., pp. 688–697, Oct. 1998.

Kenneth R. Laker et al., Design of Analog Integrated Circuits and Systems, New York, NY: McGraw–Hill, International Editions 1994.

* cited by examiner

Primary Examiner—Dinh T Le
(74) Attorney, Agent, or Firm—Volentine Francos, PLLC

(57) ABSTRACT

A transconductance-capacitance filter having a plurality of transconductors, that operates in a normal operation mode and a testing/tuning operation mode. During the normal operation mode, the transconductors operate as having normal transconductances. During the testing/tuning operation mode, the transconductances are scaled by a same amount, so that frequencies of the test signals provided are lower than in the normal operation mode, and so that transfer characteristics of the filter can be easily verified.

15 Claims, 18 Drawing Sheets

US 6,806,765 B2

METHOD AND APPARATUS FOR CHECKING THE RESPONSE OF A TRANSCONDUCTANCE- CAPACITANCE FILTER

BACKGROUND OF THE INVENTION

1. Field of the Invention

The present invention relates to a transconductance-capacitance filter, and a method of verifying transfer characteristics in a transconductance-capacitance filter. More particularly, the present invention relates to a transconductance-capacitance filter, and a method of verifying the transfer characteristic of a high-frequency integrated continuous-time filter of a transconductance-capacitance (gm-C) type.

2. Description of the Background Art

The four basic linear operations (integration, scaling, summation, inversion) used to synthesize a large class of transfer functions can be easily implemented using only transconductors and capacitors. For example, a transconductor loaded with a capacitor acts as a voltage input—voltage output integrator. Scaling is done by changing the transconductance of the transconductor and/or the capacitance of the load capacitor. The output currents of a plurality of transconductors can be summed by tying the outputs to a same node. Also, inversion can be done for instance by crossing inputs of a transconductor.

The basic building block of a transconductance-capacitance filter is a multiple input transconductance-capacitance integrator. This block can perform all of the above noted basic operations. The filter appears as a collection of interconnected multiple input transconductance-capacitance integrators. In an integrated circuit, both the transconductance of the transconductor and the capacitance of the capacitor are subject to influences such as fabrication processes, power supply and temperature variations. Thus, it is required to check the conformity of the implemented transfer function and to tune the filter so as to fulfill the designed function. Most of the tuning effort is directed toward adjusting the transconductance of the transconductors.

One of the conventional direct methods of checking the transfer function of a continuous-time filter consists of applying a constant amplitude, variable (sweeping) frequency sinusoidal signal at the input of the filter and measuring the amplitude and the phase of the resulting waveform at the output of the filter. Indirect methods, in contrast, analyze the step response of the filter. These known methods require the generation of a test signal (either on-chip or off-chip), applying the test signal at the input of the circuit under test (CUT), and reading and processing the response of the circuit. This can be done either on-chip or off-chip. For tuning purposes, the response of the filter is used in a feedback configuration to adjust its parameters.

FIGS. 1–5 are block diagrams showing circuit configurations of conventional checking methods. FIG. 1 is a block diagram showing a testing circuit 100 for an integrated filter with an external test signal source 105 and an external generic analyzer 145. As shown in FIG. 1, the testing circuit 100 includes an input buffer 110 coupled to the output of external test signal source 105, a circuit under test (CUT) 115, an output buffer 140 that provides an output to external analyzer 145, first switch 130 connected between input buffer 110 and CUT 115, second switch 135 connected between CUT 115 and output buffer 140, and an internal circuit 120 connected to receive a signal from second switch 135 and to provide a signal to first switch 130. In this circuit, input buffer 110, CUT 115, internal circuit 120, first and second switches 130 and 135, and output buffer 140 are all formed on a semiconductor chip 150, while the external test signal source 105 and the external analyzer 145 are formed off the chip 150.

The CUT 115 can be connected through the first and second switches 130 and 135 either to the internal circuit 120, or to the input and output buffers 110 and 140. When connected to input and output buffers 110 and 140 by first and second switches 130 and 135, CUT 115 is connected to the external test signal source 105 and the external analyzer 145. The first and second switches are controlled by switching signals SW. The switching signals SW indicate either a normal operation state (connecting the switches 130 and 135 to normal nodes N), or a test operation state (connecting the switches 130 and 135 to test nodes T).

FIG. 2 is a block diagram showing a testing circuit 200 for an integrated filter that is similar to the circuit shown in FIG. 1. However, an external analog-to-digital converter (ADC) 255 and digital signal processor (DSP) 260 are included in place of external analyzer 145 of FIG. 1. The testing circuit 200 of FIG. 2 is thus similar to the testing circuit 100 of FIG. 1, but the analyzer device is DSP-based. In this circuit shown in FIG. 2, input buffer 110, CUT 115, internal circuit 120, first and second switches 130 and 135, and output buffer 140 are all formed on a semiconductor chip 250, while the external test signal source 105, the external ADC 255, and the external DSP 260 are formed off chip 250. The external ADC 255 of the testing circuit 200 acts as the interface between the CUT 115 and the DSP 260. Since the ADC 255 is external, it can also be used for other functions external to the chip 250.

FIG. 3 is a block diagram showing a testing circuit 300 for an integrated filter that is similar to the circuit shown in FIG. 2. However, an internal ADC 355 is provided on the semiconductor chip 350, in place of output buffer 140 of FIG. 2. Also, external ADC 255 of FIG. 2 is not included in the circuit as shown in FIG. 3. The internal ADC 355 is coupled to receive an output from second switch 135 and provides an output directly to external DSP 260. Internal ADC 355 is dedicated to test/tuning purposes. In this circuit as shown in FIG. 3, input buffer 110, CUT 115, internal circuit 120, first and second switches 130 and 135, and internal ADC 355 are all formed on semiconductor chip 350, while the external test signal source 105 and the external DSP 260 are formed off chip 350. Since the internal ADC 355 is disposed on semiconductor chip 350, there is no need for an analog output buffer on chip 350 for testing the CUT 115. In operation, the chip 350 receives an analog test signal, and outputs a digital test signal.

FIG. 4 is a block diagram showing a testing circuit 400 for an integrated filter that is similar to the circuit shown in FIG. 3. However, internal test signal source 405 is provided on semiconductor chip 450, in place of external test signal source 105 of FIG. 3. Internal test signal source 405 provides a test signal directly to first switch 130. Input buffer 110 of FIG. 3 is not included in the circuit as shown in FIG. 4. Also, an internal DSP 460 is provided on chip 450, in place of external DSP 260 of FIG. 3. Internal DSP 460 directly receives an output of internal ADC 355. Internal DSP 460 is dedicated to test/tuning purposes. In this circuit as shown in FIG. 4, internal test signal source 405, CUT 115, internal circuit 120, first and second switches 130 and 135, internal ADC 355, and internal DSP 460 are all formed on semiconductor chip 450. Since the signal source 405 and the ADC 355 are both internal, there is no need for input and output buffers on chip 450 for testing the CUT 115. In operation, chip 450 generates input signals internally, and outputs a digital signal.

FIG. 5 is a block diagram showing a testing circuit 500 for an integrated filter that is similar to the circuit shown in FIG. 4. However, CUT 115 and internal ADC 555 are formed on main circuit 570. In other words, the internal ADC 355 of FIG. 4 is moved to be part of main circuit 570 as shown in FIG. 5. Internal ADC 555 receives an output directly from CUT 115, and provides an output to second switch 135. As previously, CUT 115 receives an input from first switch 130. In the circuit of FIG. 5, the internal ADC 555 is part of main circuit 570, and is shared as for normal operation with internal circuit 120 and as for test/tuning. In this circuit of FIG. 5, internal test signal source 405, main circuit 570, internal circuit 120, first and second switches 130 and 135, and internal DSP 460 are all formed on semiconductor chip 550.

In the testing circuit 500 of FIG. 5, internal ADC 555 is part of main circuit 570, and operates with CUT 115 during normal operation. In other words, when the switch signals SW indicate a normal mode (i.e., connecting the switches 130 and 135 to the normal nodes N), the internal circuit 120 is connected to both internal ADC 555 and CUT 115, so that internal circuit 120 uses internal ADC 555 during normal operation.

However, providing an external high-frequency test signal to a chip and channeling the external high-frequency test signal to the input of CUT 115 as in FIGS. 1–3, is an operation prone to errors because of parasitic elements, noise, DC offset and non-linear behavior of interface blocks. Extracting the response of the circuit requires interface blocks that must be able to drive external pads while keeping the loading of the CUT 115 at a minimum.

On the other hand, generating a high-frequency test/tuning signal on-chip as in FIGS. 4 and 5 requires special circuitry, such as a low-noise, accurately controlled amplitude sinusoidal oscillator. Furthermore, reading of the high-frequency response on-chip requires either special analog blocks such as precision amplitude discriminators, or an on-chip high-speed analog-to-digital converter (ADC) as well as on-chip or off-chip digital signal processing (DSP) capabilities. In the latter case, high-speed digital communication with the external test equipment is required.

It is therefore desirable to provide an easier to implement method of testing the transfer characteristic of a high-frequency integrated continuous-time filter.

SUMMARY OF THE INVENTION

The present invention is therefore directed to a transconductance-capacitance filter, and a method of verifying the transfer characteristics of a high-frequency integrated continuous-time filter of a tranconductance-capacitance type, that substantially overcome one or more of the problems due to the limitations and disadvantages of the related art.

It is thus an object of the present invention to overcome or at least minimize the various drawbacks associated with conventional techniques for testing the transfer characteristic of a high-frequency integrated continuous-time filter.

In accordance with this invention, a transconductance-capacitance integrator is provided that includes a plurality of transconductors that provide transconductor output currents; a current follower that provides an output current; a capacitor, coupled to the current follower, that provides an output voltage of the transconductance-capacitance integrator responsive to the output current; a scaling circuit that scales the transconductor output currents of the plurality of transconductors by a same scaling factor to provide a scaled transconductor output current; and a mode switch that is operable in a test/tuning operation mode to provide the scaled transconductor output current to the current follower and in a normal operation mode to provide the transconductor output current to the current follower.

The transconductors preferably have a first transconductance in the normal operation mode, and have a second transconductance in the test/tuning operation mode. In this case, the second transconductance may be obtained by dividing the output currents of the transconductors.

In test/tuning mode, the output currents of all of the transconductors may be divided by the same ratio.

The second transconductances may be obtained by dividing the output currents of the transconductors through resistive dividers.

Also in accordance with this invention, a method of verifying a transfer function of a tranconductance-capacitance filter including a plurality of transconductors that provide transconductor output currents, includes converting the transconductor output currents into a first set of output voltages during a normal operation mode of the transconductance-capacitance filter; and scaling the transconductor output currents by a scaling factor to provide a set of scaled transconductor output currents and converting the set of scaled transconductor output currents into a second set of output voltages for verifying the transfer function, during a test/tuning operation mode of the transconductance-capacitance filter.

Also in further accordance with this invention, a direct on-chip closed loop tuning system includes a first filter having a plurality of first transconductors that provide a first set of transconductor currents, a first set of adders that add the first transconductor currents to provide a first set of transconductor output currents and a first set of scalers that scale the set of first transconductor output currents to provide a set of scaled first transconductor output currents, the first filter being operable in a normal operation mode to output a first set of first transconductor output currents and in a test/tuning operation mode to output a set of scaled first transconductor output currents; a second filter having a plurality of second transconductors that provide a second set of transconductor currents, a second set of adders that add the second set of transconductor currents to provide a set of second transconductor output currents and a second set of scalers that scale the second set of transconductor output currents to provide a scaled second set of transconductor output currents, the second filter being operable in the normal operation mode to output a set of second transconductor output currents and in the test/tuning operation mode to output the scaled set of second transconductor output currents; and a controller that simultaneously switches one of the first and second filters into the normal operation mode and another of the first and second filters into the test/tuning operation mode.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

In an effort to solve the problems listed above, this invention provides a method and circuit for measuring frequency response, the method and circuit being useful for checking the integrity of the filter circuit and/or for tuning purposes.

The preferred embodiments of the invention involve maintaining a regular filter transconductance for normal operation, but scaling down all the transconductances of the filter by the same factor for testing and/or tuning purposes. Thus, the transconductances of the filter are all scaled down by the same factor m, through resistive dividers for example. This scaling down of transconductances is the equivalent of scaling up all the capacitances of the chip by the same factor m.

The magnitude and the phase of the frequency response of the scaled-down filter will retain the shape of the corresponding characteristics of the normal operation filter, but will be in a correspondingly reduced frequency domain. The relatively low frequency output signal of the scaled-down filter is easier to measure on-chip, or to extract and measure off-chip.

The preferred embodiments provide a low cost, low area penalty approach to significantly reduce the drawbacks associated with the measurements of high frequency characteristics. In the preferred embodiments, the frequencies that must be measured can be reduced from tens of MHz down to one MHz or lower. For systems that include an analog-to-digital converter (ADC) in the same signal path as the filter to be tested, for instance systems where the filter is used for anti-aliasing purposes in front of the ADC, the response of the scaled-down analog filter can be digitized on chip and processed on-chip or off-chip at a lower speed.

By dividing all the output currents injected by the transconductors into the corresponding capacitors by the same factor m, the corresponding capacitors in the transfer function of the filter appear as if multiplied by the factor m. Since the output currents of all the relevant transconductances of the filter are divided by the same factor m, the magnitude and phase characteristics of the filter will have a similar shape but will be translated to a lower frequency.

It is to be understood that the following concepts of the preferred embodiments are generally applicable to filters of various orders and configurations. However, for purposes of illustration only, second-order filter sections are considered in the preferred embodiments. Also, the building blocks of the transconductance-capacitance filters of the preferred embodiments are a transconductor, a current adder and a capacitor. A generic transconductor with a current adder (a GMA) is considered with reference to FIG. 6, for the case of two transconductors.

Figure 6:
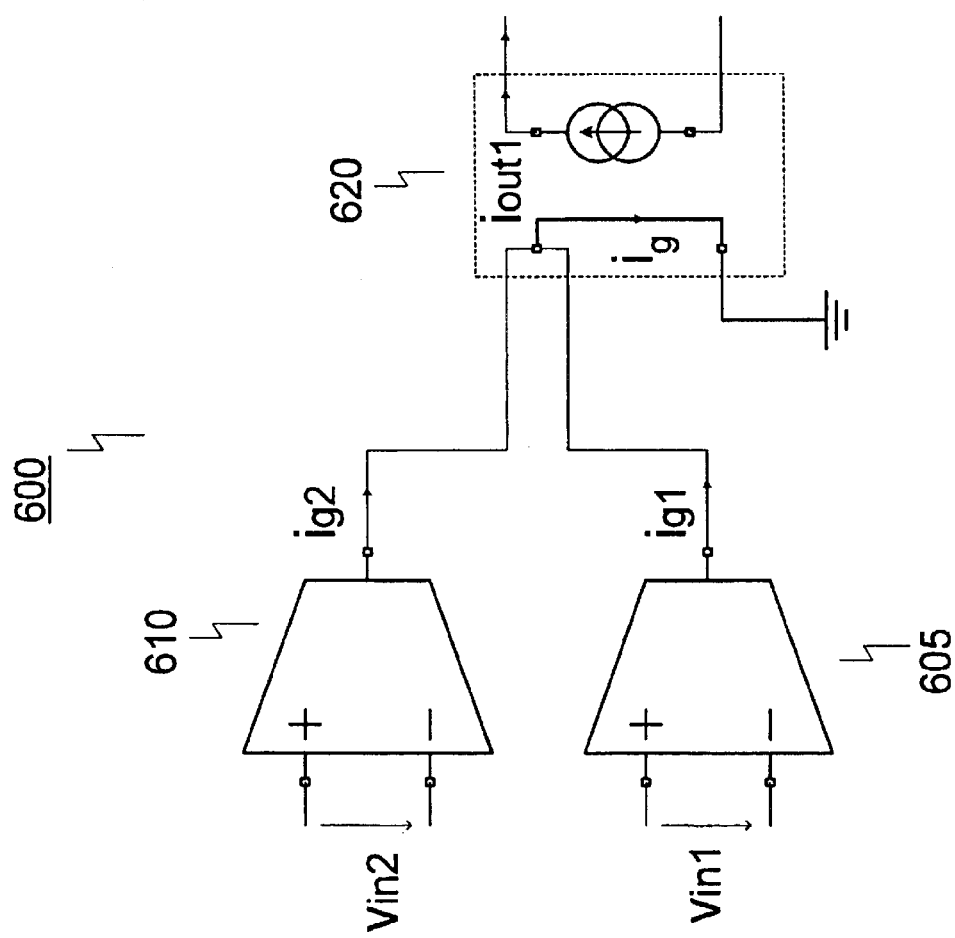
FIG. 6 is a circuit diagram of a multiple input transconductor with a current adder and a current follower (GMA)

FIG. 6 is a circuit diagram of a multiple input transconductor with a current follower (GMA). As shown in FIG. 6, the GMA 600 includes first and second transconductors 605 and 610, and a current follower 620. Output currents $i_{g1}$ and $i_{g2}$ from first and second transconductors 605 and 610 are provided to current follower 620.

The first and second transconductors 605 and 610 respectively have first and second transconductances $g_{m1}$ and $g_{m2}$, and input voltages $v_{in1}$ and $v_{in2}$ respectively input thereto. First and second transconductors 605 and 610 are differential input voltage-to-current converters, ideally having infinite input and output impedances. The output currents $i_{g1}$ and $i_{g2}$ of the first and second transconductors 605 and 610, respectively, are determined by the following equations:

$$i_{g1}=g_{m1} \cdot v_{in1} \quad (1),$$

and $$i_{g2}=g_{m2} \cdot v_{in2} \quad (2),$$

where $g_{m1}$ is the transconductance of the first transconductor 605, $g_{m2}$ is the transconductance of the second transconductor 610, $v_{in1}$ is the input voltage of the first transconductor 605, and $v_{in2}$ is the input voltage of the second transconductor 610. The current follower 620, which ideally has zero input impedance and infinite output impedance, adds the first and second output currents $i_{g1}$ and $i_{g2}$ and provides the output current $i_{out1}$ according to the following equation:

$$i_{out1} = i_{g1} + i_{g2} = g_{m1} \cdot v_{in1} + g_{m2} \cdot v_{in2} \qquad (3).$$

Figure 7:
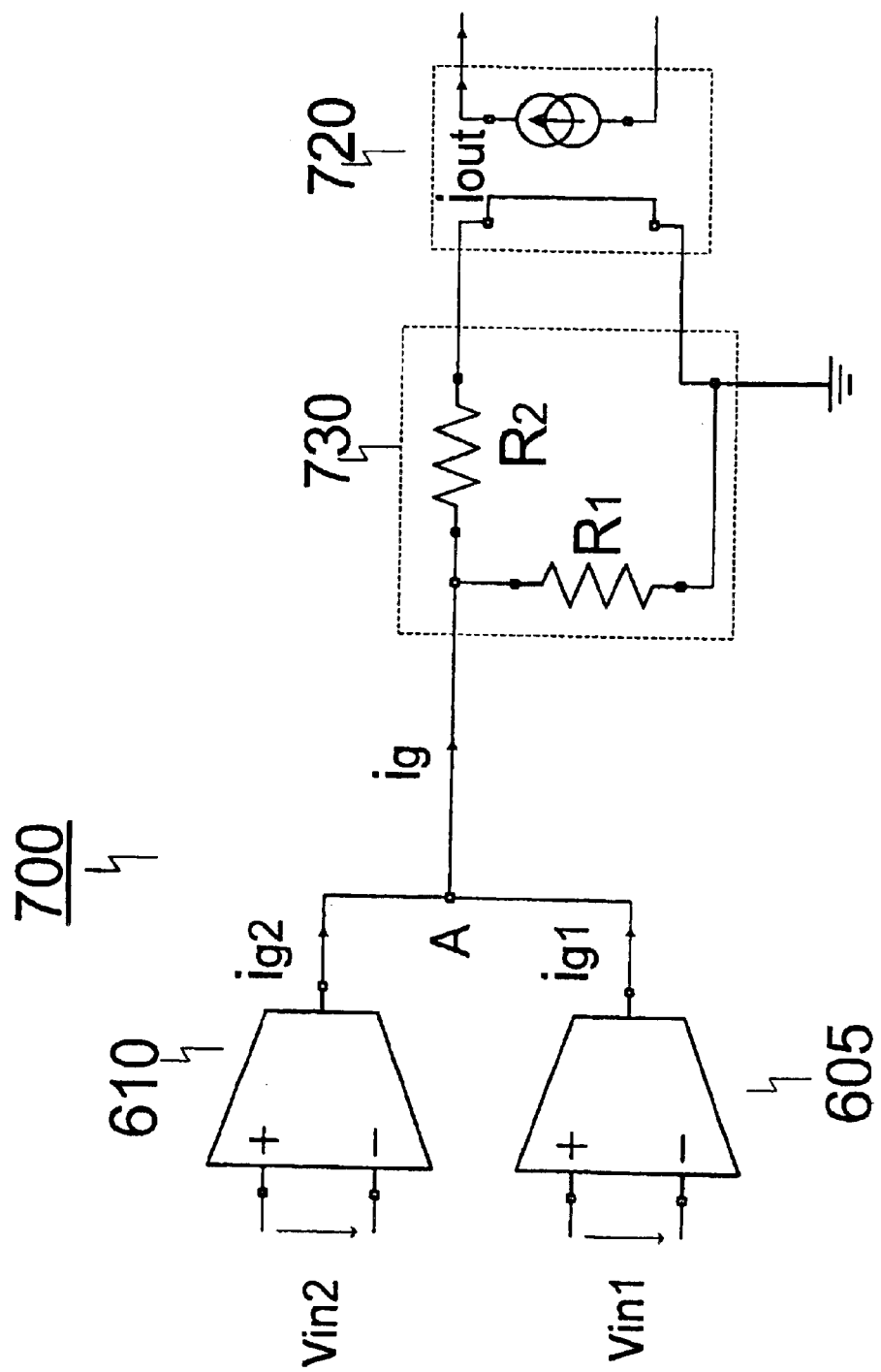
FIG. 7 is a circuit diagram of a multiple input transconductor with a current adder, a resistive current divider, and a current follower (SGMA)

The output current $i_{out1}$ of a GMA can be scaled by the use of a current divider between a summing point of the transconductors and the zero input impedance of the current follower. An example of such a scaled output current GMA (or SGMA) is shown in FIG. 7. FIG. 7 is a circuit diagram of a multiple input transconductor with a current adder, a resistive divider, and a current follower. As shown in FIG. 7, the SGMA 700 includes first and second transconductors 605 and 610, a current follower 720, and a resistive divider 730. The resistive divider 730 is disposed between the first and second transconductors 605 and 610 and the current follower 720, and includes first and second resistors $R_1$ and $R_2$ for example. That is, first and second output currents $i_{g1}$ and $i_{g2}$ are combined at node A to provide transconductance current $i_g$. The first ends of first and second resistors $R_1$ and $R_2$ are coupled to transconductor current $i_g$. A second end of the second resistor $R_2$ is coupled to a respective input of current follower 720. A second end of first resistor $R_1$ is coupled to ground, and another respective input of current follower 720 is also coupled to ground.

The output current $i_{out2}$ of the SGMA 700 is determined by the formula:

$$i_{out2} = \frac{R_1}{R_1 + R_2} \cdot (g_{m1} \cdot v_{in1} + g_{m2} \cdot v_{in2}), \qquad (4)$$

where $R_1$ is the resistance of the first resistor and $R_2$ is the resistance of the second resistor. Thus, the output current $i_{out2}$ of the SGMA 700 is similar to the output current $i_{out1}$ of the GMA 600, except that the output current $i_{out2}$ of the SGMA 700 is scaled down by the resistive divider 730.

Figure 8:
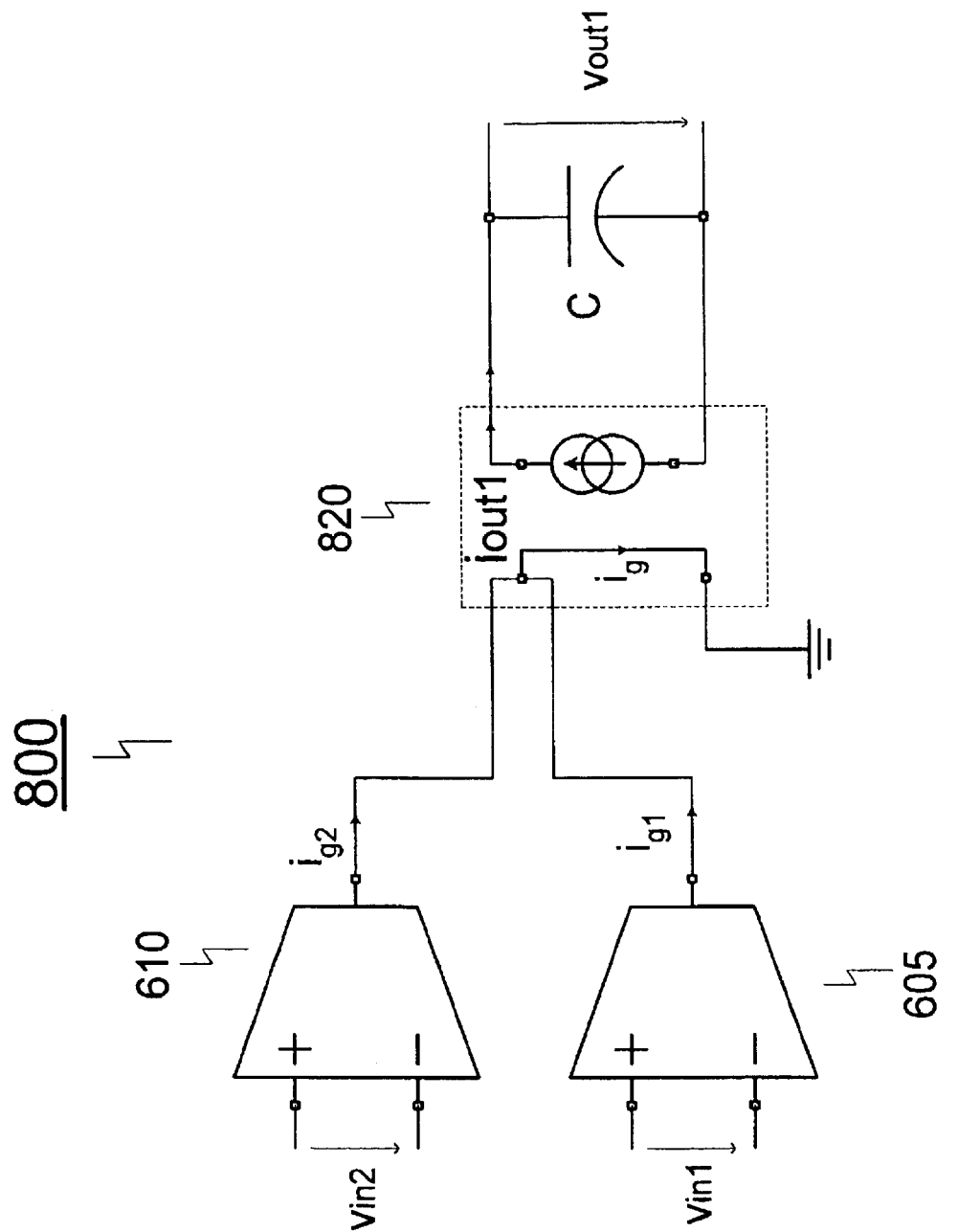
FIG. 8 is a circuit diagram of a voltage input-voltage output multiple input transconductance-capacitance continuous-time integrator (GMAC)

The basic building block of a continuous-time transconductance-capacitance filter is a voltage input-voltage output integrator built out of a GMA loaded with a capacitor (GMAC). FIG. 8 is a circuit diagram of such a voltage input-voltage output transconductance-capacitance continuous-time integrator (GMAC). As shown in FIG. 8, the GMAC 800 includes first and second transconductors 605 and 610, and a current follower 820, configured somewhat similarly as in FIG. 6. However, capacitor C is connected to the output of the current follower 820 to convert the output current $i_{out1}$ to an output voltage $v_{out1}$.

Figure 9:
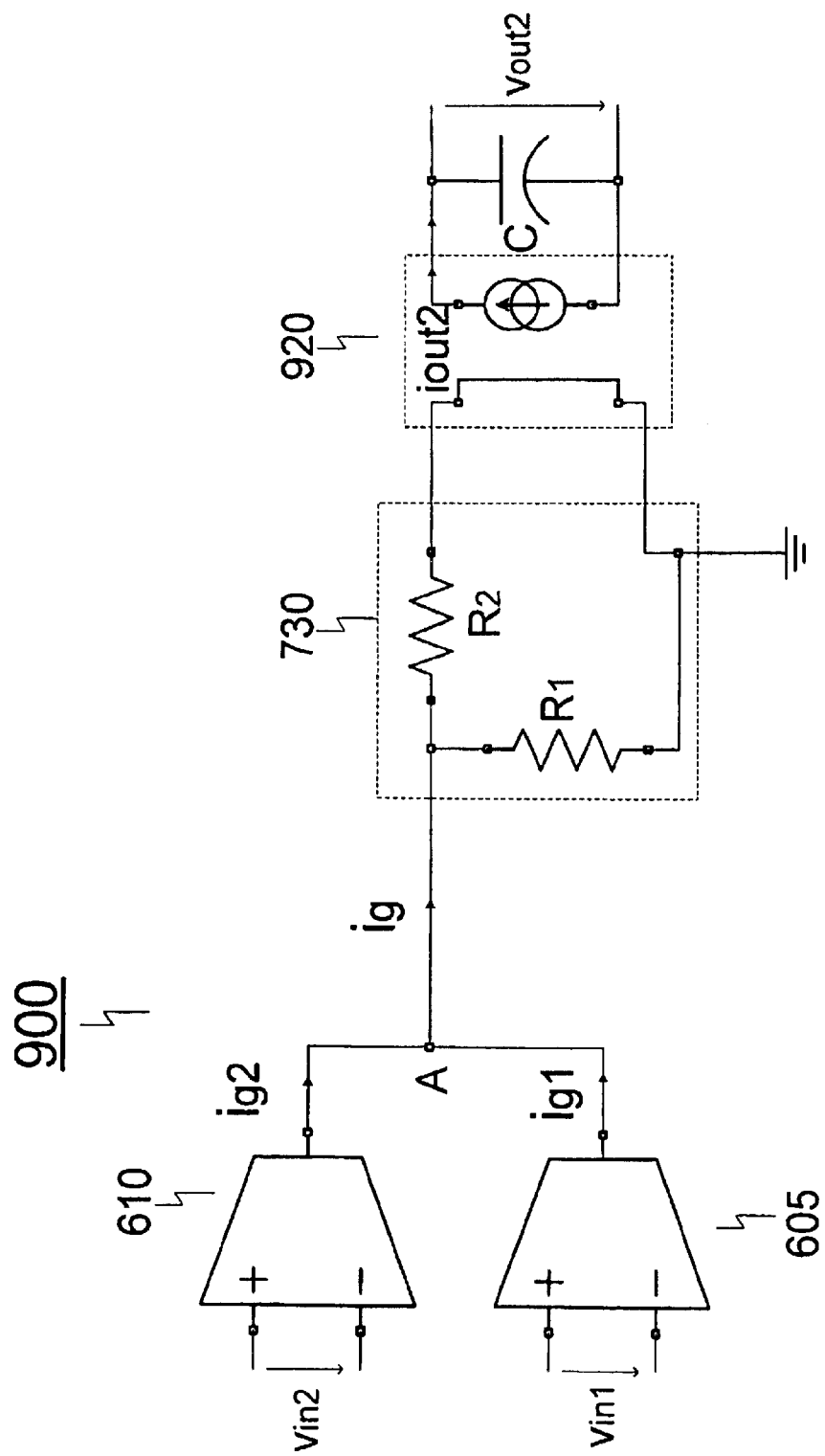
FIG. 9 is a circuit diagram of a scaled voltage input-voltage output transconductance-capacitance multiple input continuous-time integrator (SGMAC)

A scaled GMA driving an output capacitor is hereinafter called an SGMAC. FIG. 9 is a circuit diagram of a scaled voltage input-voltage output transconductance-capacitance continuous-time integrator (SGMAC). As shown in FIG. 9, the SGMAC 900 includes first and second transconductors 605 and 610, a current adder, a current follower 920, a resistive divider 730 and a capacitor C coupled to the output of current follower 920. Resistive divider 730 is configured, and coupled to the sum of transconductor currents $i_g$ provided from node A and current follower 920, in a similar manner as featured in FIG. 7. As with GMAC 800 of FIG. 8, capacitor C in SGMAC 900 is connected to the output of the current follower 730, to convert the output current $i_{out1}$ to an output voltage $v_{out1}$.

An SGMAC may be implemented using multiple differential pairs injecting current through resistive dividers into a capacitor loaded folded-cascode stage as the current follower. Since the input impedance of the real folded-cascode is greater than zero, the equivalent resistance of the resistive divider should be large enough as not to significantly affect the accuracy of the current division.

Figure 10:
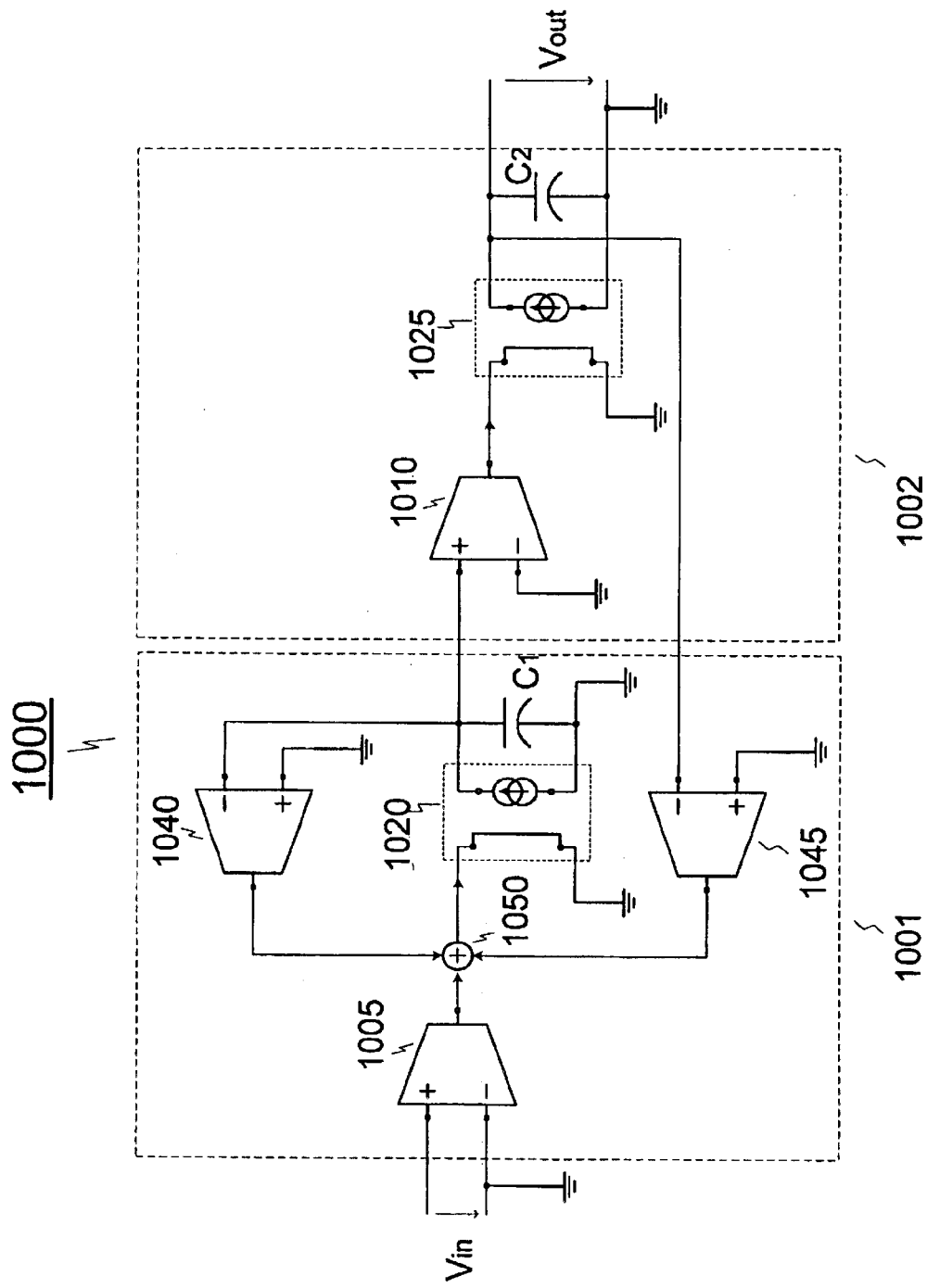
FIG. 10 is a circuit diagram of a second order, continuous-time transconductance-capacitance filter built with GMAC cells.

FIG. 10 shows a continuous-time transconductance-capacitance filter 1000 built with GMAC cells. The disclosed filter 1000 is a second order filter, i.e., a biquad filter. The filter of FIG. 10 includes a three-transconductor GMAC 1001 and a single-transconductor GMAC 1002 formed together in a feedback loop. As shown in FIG. 10, the three-transconductor GMAC 1001 includes a first input transconductor 1005 having input voltage $v_{in1}$ applied thereto, an adder 1050 coupled to an output of first input transconductor 1005, and a first current follower 1020 coupled to an output of adder 1050. A first capacitor $C_1$ is coupled to the output of first current follower 1020. A first feedback transconductor 1040 is coupled to a first end of first capacitor $C_1$, and provides and output to adder 1050. A second feedback transconductor 1045 also provides an output to adder 1050. The single-transconductor GMAC 1002 includes a second input transconductor 1010 that is coupled to the first end of first capacitor $C_1$. A second current follower 1025 is connected to an output of second input transconductor 1010. A second capacitor $C_2$ is connected to the output of second current follower 1025. Also, an output of second current follower 1025 at a first end of second capacitor $C_2$ is provided to second feedback transconductor 1045.

The transfer function T(s) of the filter 1000 relative to the input voltage $v_{in}$ and the output $v_{out}$ is shown by the equation:

$$T(s) = \frac{V_{out}(s)}{V_{in}(s)} = \frac{g_{m1} \cdot g_{m2}}{(C_1 \cdot C_2) \cdot s^2 + (g_{m3} \cdot C_2) \cdot s + (g_{m2} \cdot g_{m4})}, \qquad (5)$$

where s is the complex frequency variable, $V_{out}(s)$ is the Laplace transform of the output voltage, $V_{in}(s)$ is the Laplace transform of the input voltage, $g_{m1}$ is the transconductance of the first input transconductor 1005, $g_{m2}$ is the transconductance of the second input transconductor 1010, $g_{m3}$ is the transconductance of the first feedback transconductor 1040, $g_{m4}$ is the transconductance of the second feedback transconductor 1045, $C_1$ represents the capacitance of the first capacitor, and $C_2$ represents the capacitance of the second capacitor.

The main parameters of the filter 1000 are the DC gain T(0), the cut-off frequency $\omega_0$, and the quality factor Q, which are determined by the following equations:

$$T(0) = \frac{g_{m1}}{g_{m4}}, \qquad (6)$$

$$\omega_0 = \sqrt{\frac{g_{m2} \cdot g_{m4}}{C_1 \cdot C_2}}, \text{ and} \qquad (7)$$

$$Q = \sqrt{\frac{g_{m2} \cdot g_{m4}}{g_{m3}^2} \cdot \frac{C_1}{C_2}}. \qquad (8)$$

Figure 11:
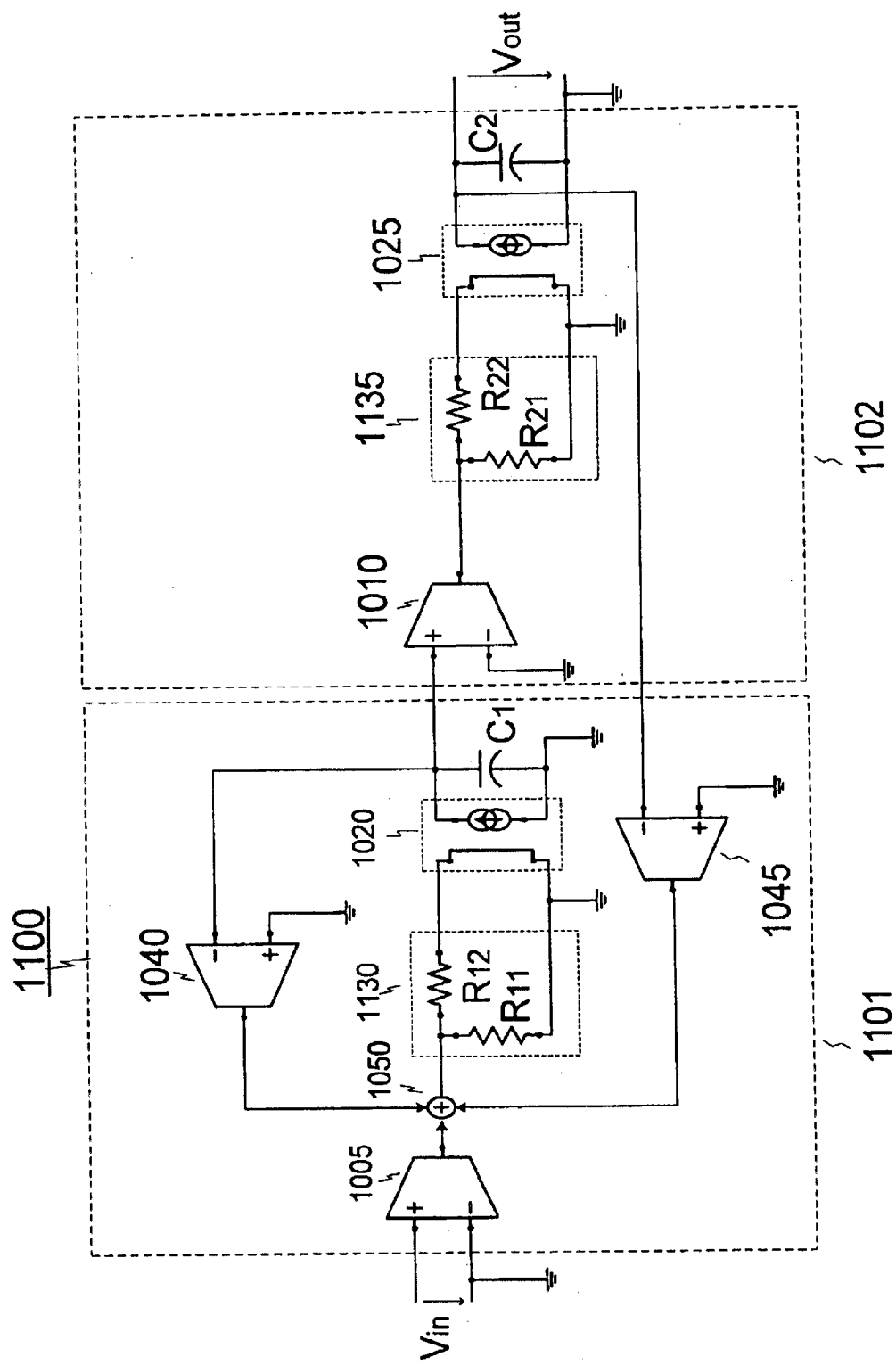
FIG. 11 is a circuit diagram of a second order, continuous-time transconductance-capacitance filter built with SGMAC cells.

FIG. 11 is a circuit diagram of a second order, continuous-time transconductance-capacitance filter built with SGMAC cells. The biquad filter 1100 of FIG. 11 is similar to the biquad filter 1000 shown in FIG. 10, except that the GMACs in FIG. 10 have been replaced by SGMACs in FIG. 11. That is, filter 1100 is also a second order filter, and includes a three-transconductor SGMAC 1101 and a single-transconductor SGMAC 1102 formed together in a feedback loop.

As shown in FIG. 11, the three-transconductor SGMAC 1101 includes all the elements of the GMAC 1001 in FIG. 10, in addition to including a first resistive divider 1130 coupled between adder 1050 and first current follower 1020. The single-transconductor SGMAC 1102 includes all the elements of the GMAC 1002 in FIG. 10, in addition to including a second resistive divider 1135 coupled between second input transconductor 1010 and second current follower 1025. The first resistive divider 1130 includes first resistors $R_{11}$ and $R_{12}$ having first ends coupled to an output of adder 1050. A second end of resistor $R_{12}$ is coupled to a corresponding input of first current follower 1020. A second end of resistor $R_{11}$ is coupled to ground, along with another corresponding input of first current follower 1020. The second resistive divider 1135 includes second resistors $R_{21}$ and $R_{22}$ having first ends coupled to an output of second input transconductor 1010. A second end of resistor $R_{22}$ is coupled to a corresponding input of second current follower 1025. A second end of resistor $R_{21}$ is coupled to ground, along with another corresponding input of second current follower 1025.

The output currents of the SGMACs are scaled by the same amount, $\alpha$, as shown in the following equation:

$$\alpha = \frac{R_{11}}{R_{11} + R_{12}} = \frac{R_{21}}{R_{21} + R_{22}}, \quad (9)$$

where $R_{11}$ and $R_{12}$ are the resistances of the first resistors and $R_{21}$ and $R_{22}$ are the resistances of the second resistors.

As a result of the resistive dividers 1130 and 1135, the output currents of the first and second current followers 1020 and 1025 are scaled by a factor of $\alpha$, compared to the outputs of the current followers in the circuit 1000 of FIG. 10. The transfer function T(s) of the filter of FIG. 11 is determined by the equations:

$$T'(s) = \frac{V_{out}(s)}{V_{in}(s)} = \frac{\alpha^2 \cdot (g_{m1} \cdot g_{m2})}{(C_1 \cdot C_2) \cdot s^2 + \alpha \cdot (g_{m3} \cdot C_2) \cdot s + \alpha^2 \cdot (g_{m2} \cdot g_{m4})}, \text{ and} \quad (10)$$

$$T'(s) = \frac{V_{out}(s)}{V_{in}(s)} = \frac{g_{m1} \cdot g_{m2}}{\left(\frac{C_1}{\alpha} \cdot \frac{C_2}{\alpha}\right) \cdot s^2 + \left(g_{m3} \cdot \frac{C_2}{\alpha}\right) \cdot s + g_{m2} \cdot g_{m4}}. \quad (11)$$

The filter 1100 of FIG. 11 is called a constant-capacitance scaled filter. Furthermore, because the same scaling factor is used for all of the transconductors, the circuit 1100 of FIG. 11 appears as a scaled capacitance version of the circuit 1000 of FIG. 10, from the transfer characteristic viewpoint.

The main parameters of the filter of FIG. 11 are the DC gain T'(0), the cut-off frequency $\omega_0'$, and the quality factor Q', which are shown by the following equations:

$$T'(0) = \frac{\alpha \cdot g_{m1}}{\alpha \cdot g_{m4}} = \frac{g_{m1}}{g_{m4}} = T(0), \quad (12)$$

$$\omega_0' = \sqrt{\frac{\alpha \cdot g_{m2} \cdot \alpha \cdot g_{m4}}{C_1 \cdot C_2}} = \alpha \cdot \omega_0, \text{ and} \quad (13)$$

$$Q' = \sqrt{\frac{(\alpha \cdot g_{m2}) \cdot (\alpha \cdot g_{m4})}{(\alpha \cdot g_{m3})^2} \cdot \frac{C_1}{C_2}} = Q. \quad (14)$$

From these equations, it should be understood that the frequency response of the scaled filter maintains the shape of the original circuit, but at a lower frequency.

Figure 12A:
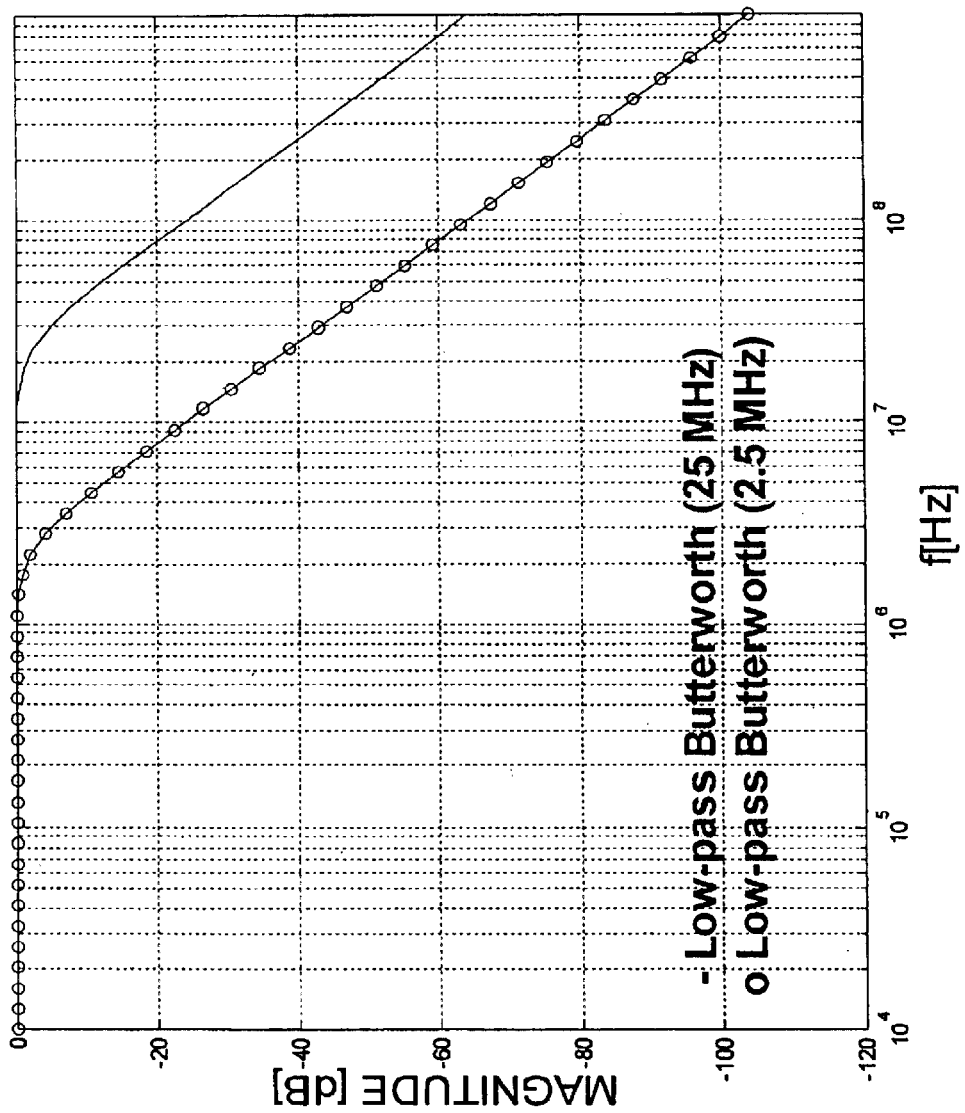
FIGS. 12A and 12B are graphs of normal and scaled magnitude and phase characteristics for a second order low-pass Butterworth filter.
Figure 12B:
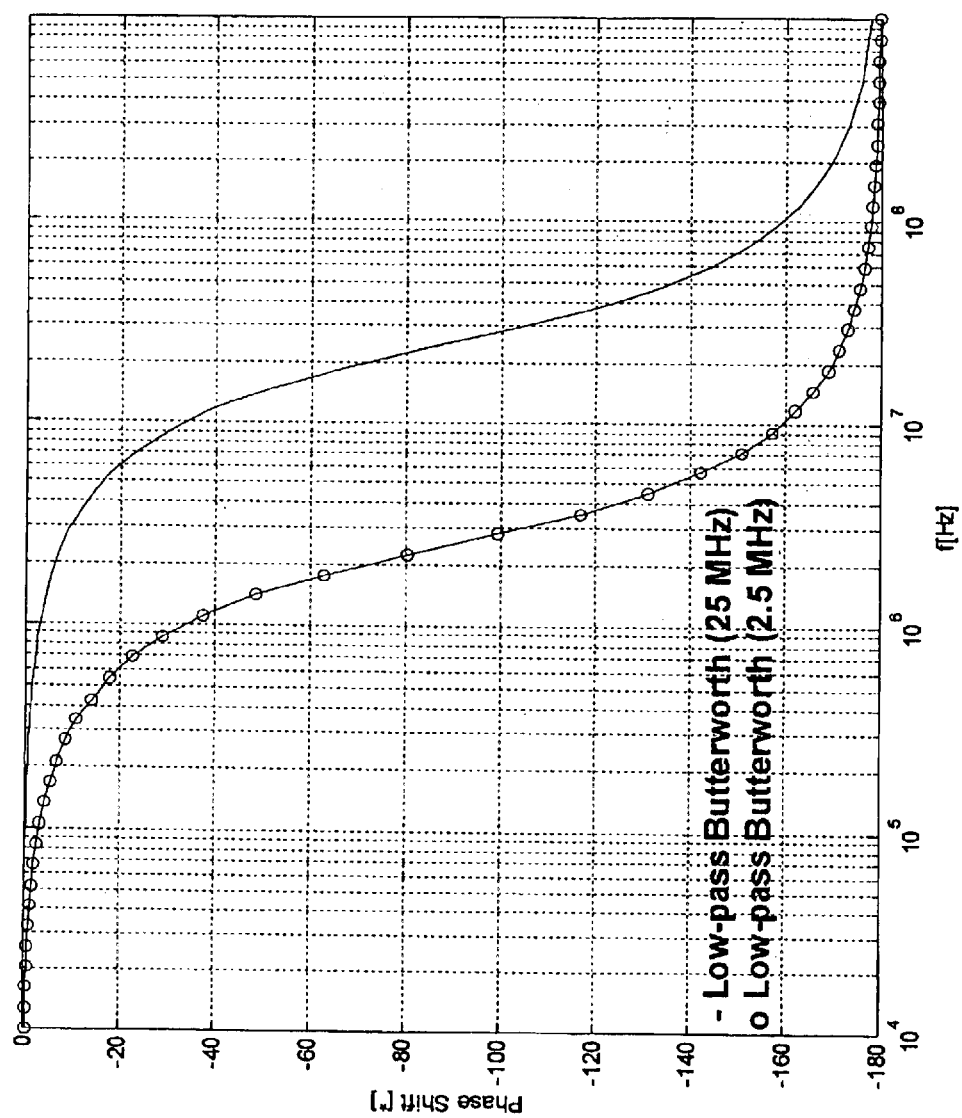

An illustration of this frequency scaling is presented in FIGS. 12A and 12B for a second-order low-pass Butterworth filter with a nominal cut-off frequency of 25 MHz and a scaled-down frequency of 2.5 MHz (i.e., $\alpha=0.1$). In particular, FIG. 12A shows the magnitude versus frequency for the nominal cut-off frequency and the scaled-down cut-off frequency, and FIG. 12B shows the phase shift versus frequency for the nominal frequency and the scaled-down frequency.

The transfer function of the 25 MHz low pass Butterworth filter of FIGS. 12A and 12B is shown by the equation:

$$T(s) = \frac{6.25 \times 10^{14}}{s^2 + 3.54 \times 10^7 s + 6.25 \times 10^{14}}, \quad (15)$$

while the transfer function of the 2.5 MHz filter is:

$$T'(s) = \frac{6.25 \times 10^{12}}{s^2 + 3.54 \times 10^6 s + 6.25 \times 10^{12}} = \frac{6.25 \times 10^{14} \alpha^2}{s^2 + 3.54 \times 10^7 \alpha s + 6.25 \times 10^{14} \alpha^2} = T\left(\frac{s}{\alpha}\right). \quad (16)$$

In a preferred embodiment of the present invention, a filter with two modes of operation is proposed. In a normal operation mode (N) the filter has transconductances with nominal values required for the filter's primary purpose. In a test/tuning (T) operation mode, all of the transconductances that are significant for the transfer characteristic of the filter are scaled by the same factor. This has the effect of translating their frequency characteristic to lower frequencies, where they will be easier to measure. The scaling of the transconductances is preferably done by current dividers placed at the outputs of the transconductors.

Figure 13A:
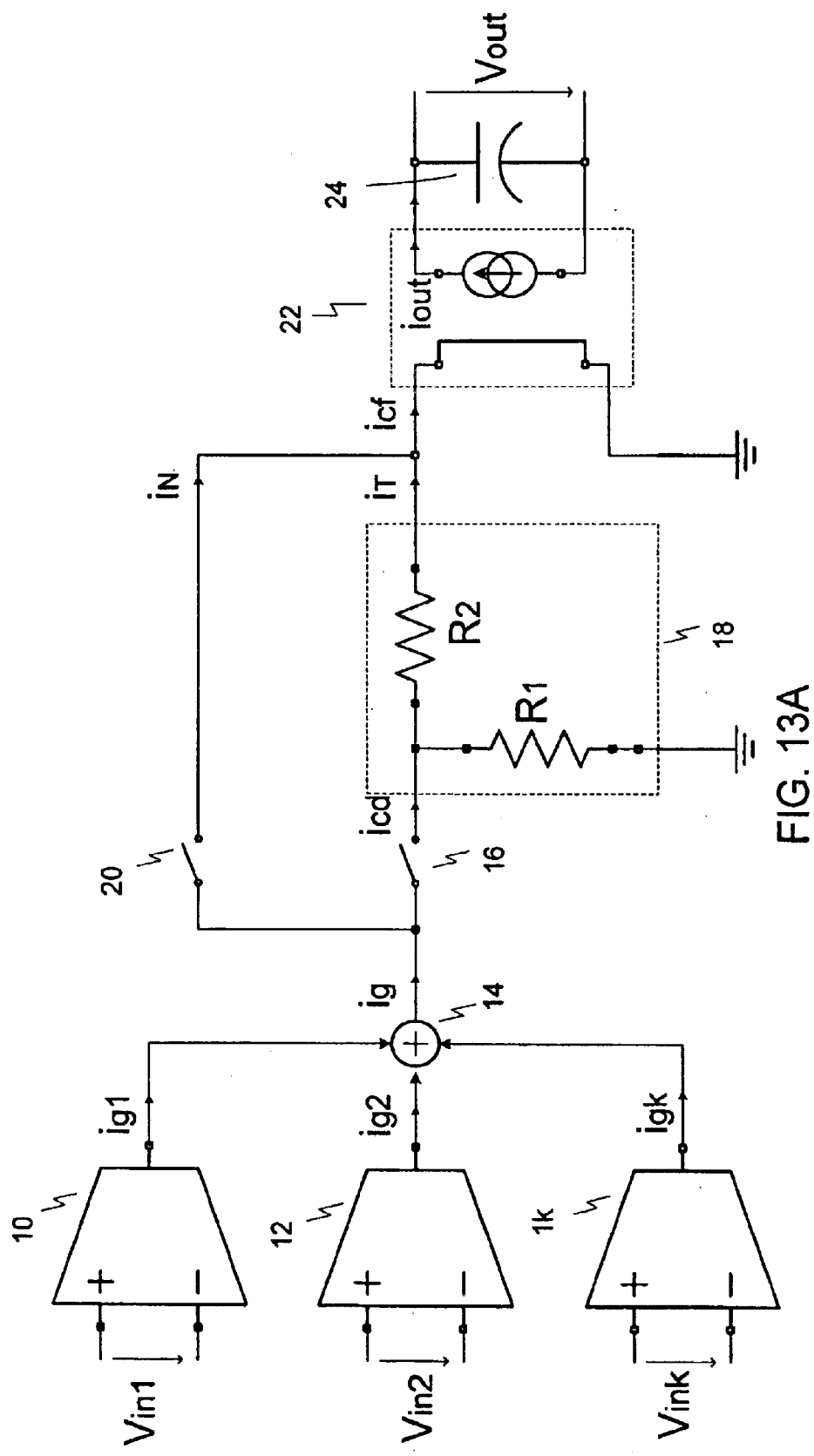
FIG. 13A is a circuit diagram of a "k" input CSGMAC.

FIG. 13A shows the basic building block of a testable/tunable continuous-time integrator, built in accordance with this invention. That is, the testable/tunable continuous-time integrator includes a plurality of the basic building blocks illustrated in FIG. 13A. The filter building block is an SGMAC with controllable scaling factor (CSGMAC). In a first mode of operation called a test/tuning mode, the scale factor is less than 1 (one). In a second mode of operation called a normal mode, the scale factor is 1 (one). The CSGMAC includes a plurality of input transconductors 10, 12 . . . 1k, having transconductance $g_{m1}, g_{m2}, \ldots g_{mk}$, which generate currents $i_{g1}=g_{m1}*v_{in1}$, $i_{g2}=g_{m2}*v_{in2}$, . . . $i_{gk}=g_{mk}*v_{ink}$, respectively. A current adder 14 adds the currents $i_{g1}, i_{g2}, \ldots i_{gk}$, and generates a current $i_g=i_{g1}+i_{g2}+ \ldots +i_{gk}$. A first switch 16, when closed, applies the current $i_g$ to an input of a current divider 18, which provides a current $i_T$ which is a fraction of input current $i_{cd}$, at an output thereof. A second switch 20, when closed, passes the current $i_g$ directly to a very low impedance input of a current follower 22, which in turns provides output current $i_{out}$. Capacitor 24 converts the output current $i_{out}$ of current follower 22 into voltage $v_{out}$.

In the normal mode of operation, second switch 20 is closed and first switch 16 is open. The current $i_g$ of the current adder 14 therefore passes through second switch 20 and is injected as current $i_N$ into the current follower 22. The input current to the current follower is thus $i_{cf}=i_N=i_g$. In this case, the output current $i_{out}$ of the current follower 22 is equal to the output current of the current adder 14. Incidentally, the current which flows into the output of the current divider 18 is negligibly small.

In the test mode of operation, second switch 20 is open and first switch 16 is closed, so that current $i_g$ is injected into the current divider 18 as the current $i_{cd}$. The output current $i_T$ of the current divider 18 is a fraction of the input current $i_{cd}=i_g$. The output current $i_{out}$ of the current follower 22 is equal to the output current of the current divider 18, or $i_{out}=i_T$.

In the embodiment as illustrated in FIG. 13A, the current divider 18 is a resistive current divider including first and second resistors $R_1$ and $R_2$, similar to the resistive divider 1130 of FIG. 11. The output current of current divider 18 is:

$$i_T = R_1/(R_1+R_2) * i_{cd} < i_{cd} \qquad (17).$$

Also, in the embodiment of FIG. 13A, the integrator GMACs of the transconductance-capacitor filter are replaced with CSGMACs having the same scaling factors. The method is exemplified in FIG. 13B for the second order transconductance-capacitance filter of FIG. 10.

Figure 13B:
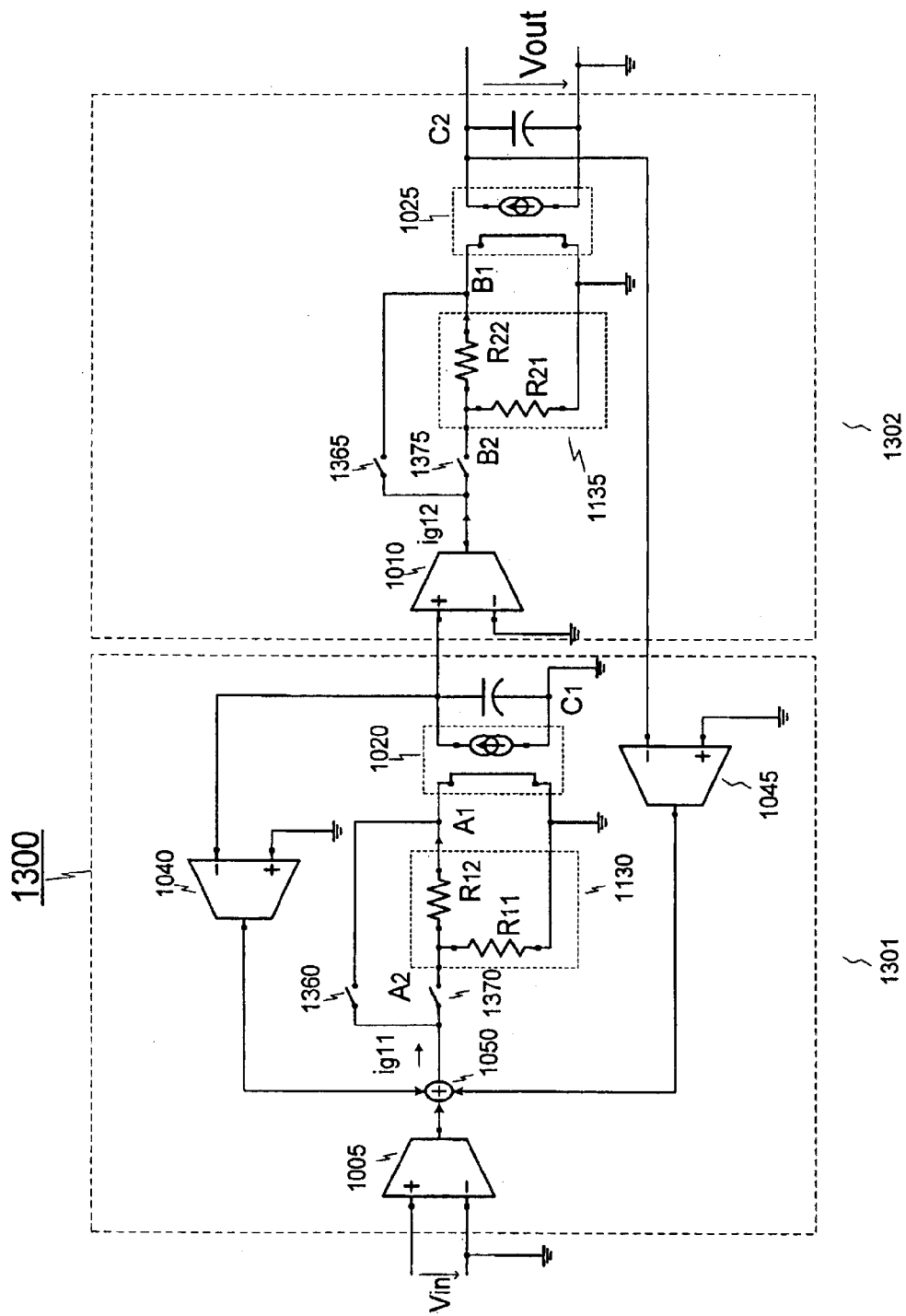
FIG. 13B is a circuit diagram of a second order filter using CSGMACs in the test/tuning mode according to a first preferred embodiment of the present invention.

FIG. 13B is a circuit diagram of a second order filter using CSGMACs in the test/tuning mode according to an embodiment of the present invention. FIG. 13B discloses a second-order filter 1300 of the same type presented in FIGS. 10 and 11. Filter 1300 includes a three-transconductor CSGMAC 1301 and a single-transconductor CSGMAC 1302 as basic building blocks formed together in a feedback loop.

As shown in FIG. 13B, the three-transconductor CSG-MAC 1301 is configured the same as SGMAC 1101 in FIG. 11, but additionally includes a first normal switch 1360 having a first end coupled to the output of adder 1050 and a second end coupled to the second end of resistor $R_{12}$ at node $A_1$. The CSGMAC 1301 further includes a first test switch 1370 having a first end coupled to the output of adder 1050 and a second end coupled to the first ends of resistors $R_{11}$ and $R_{12}$ at node $A_2$. The single-transconductor SGMAC 1302 is configured the same as CSGMAC 1102 in FIG. 11, but additionally includes a second normal switch 1365 having a first end coupled to the output of second input transconductor 1010 and a second end coupled to the second end of resistor $R_{22}$ at node $B_1$. CSGMAC 1302 further includes a second test switch 1375 having a first end coupled to an output of second input transconductor 1010 and a second end coupled to the first ends of resistors $R_{21}$ and $R_{22}$ at node $B_2$.

The first and second normal switches 1360 and 1365 are closed during a normal operation mode and are opened during a testing/tuning mode. In contrast, the first and second test switches 1370 and 1375 are open during a normal operation mode and are closed during a testing/tuning mode. As a result of this, the output current $i_{g11}$ is injected into the input node $A_1$ at the first current follower 1020 through the first normal switch 1360 when in the normal mode, and into the input node $A_2$ at the first resistive divider 1130 through the first test switch 1370 when in the test mode. Similarly, the output current $i_{g12}$ is injected into the input node $B_1$ at the second current follower 1025 through the second normal switch 1365 when in the normal mode, and into the input node $B_2$ at the second current divider 1135 through the second test switch 1375 when in the test mode.

In this embodiment, the first and second resistive dividers 1130 and 1135 have the same ratio, as shown in the following equation:

$$\alpha = \frac{R_{11}}{R_{11}+R_{12}} = \frac{R_{21}}{R_{21}+R_{22}}. \qquad (18)$$

In the normal operation mode, the transfer function $T_{12}(s)$ of the circuit 1300 is shown by the equation:

$$T_{12}(s) = \frac{V_{out}(s)}{V_{in}(s)} = \frac{(g_{m1} \cdot g_{m2})}{(C_1 \cdot C_2) \cdot s^2 + (g_{m3} \cdot C_2) \cdot s + (g_{m2} \cdot g_{m4})}. \qquad (19)$$

In the test operation mode, the transfer function $T'_{12}(s)$ of the circuit 1300 is shown by the equation:

$$T'_{12}(s) = \frac{V_{out}(s)}{V_{in}(s)} = \frac{g_{m1} \cdot g_{m2}}{\left(\frac{C_1}{\alpha} \cdot \frac{C_2}{\alpha}\right) \cdot s^2 + \left(g_{m3} \cdot \frac{C_2}{\alpha}\right) \cdot s + g_{m2} \cdot g_{m4}}. \qquad (20)$$

Furthermore, in the test mode, the magnitude of the frequency response $T_{12}(S)$ is scaled to lower frequencies according to the following equation:

$$T'_{12}(s) = T_{12}\left(\frac{s}{\alpha}\right). \qquad (21)$$

However, this low frequency response $T_{12}(S)$ accurately reflects the shape of the high frequency response, and at the same time is easier to check.

Figure 1:
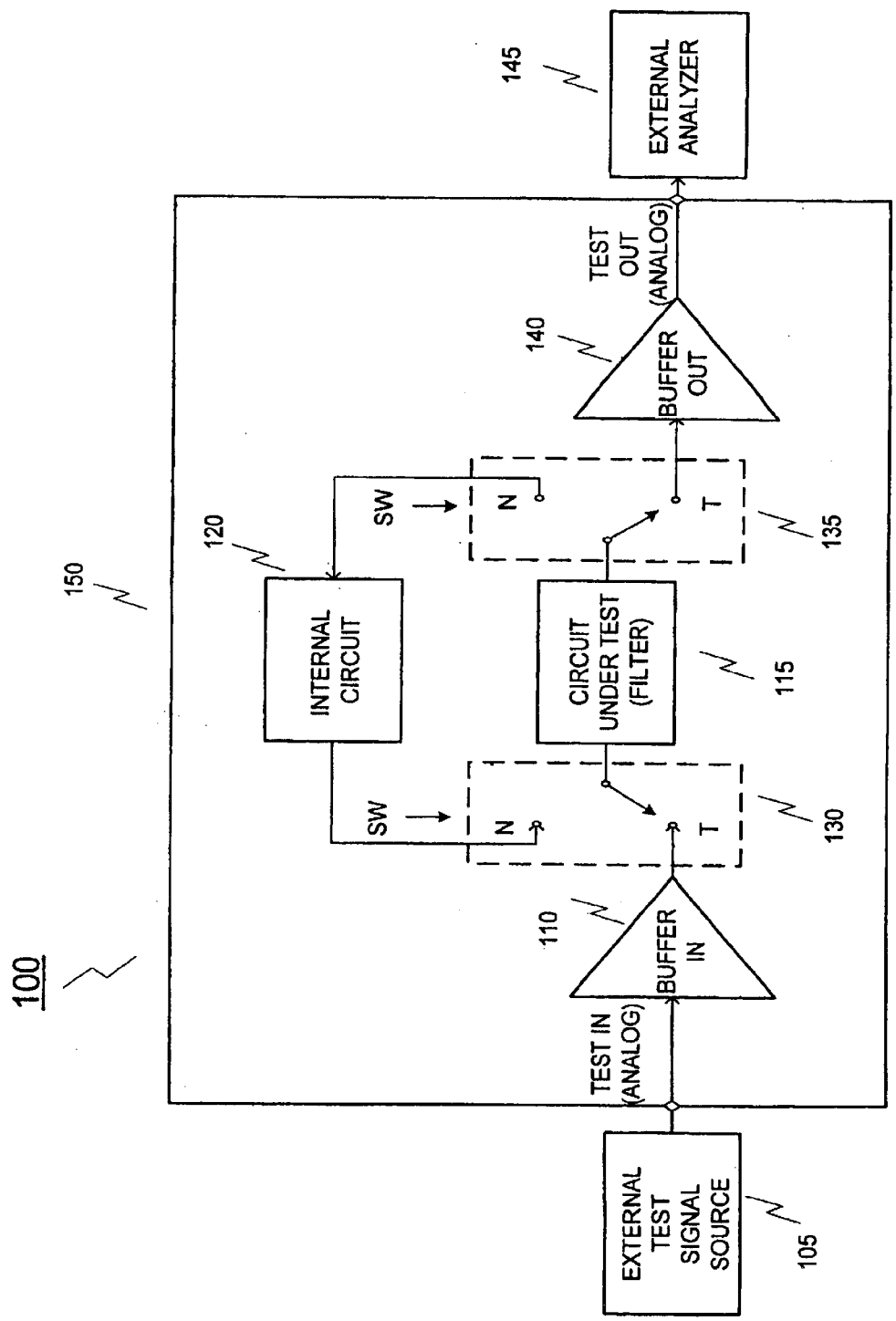
FIG. 1 is a block diagram showing a conventional circuit for testing an integrated filter, including an external test signal source and an external generic analyzer.
Figure 2:
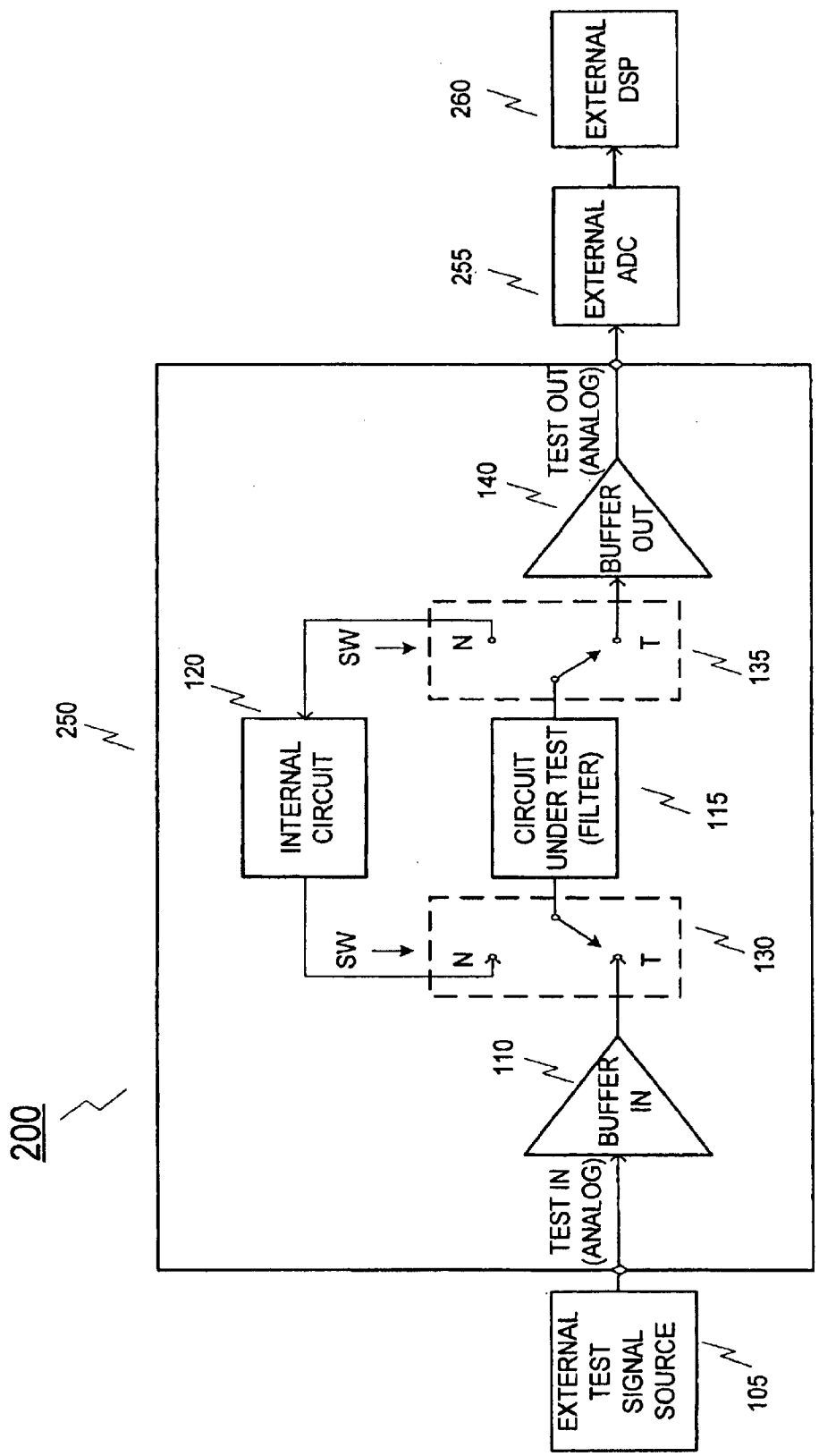
FIG. 2 is a block diagram showing a conventional circuit for testing an integrated filter, including an external test signal source, an external ADC and an external DSP-based analyzer.
Figure 3:
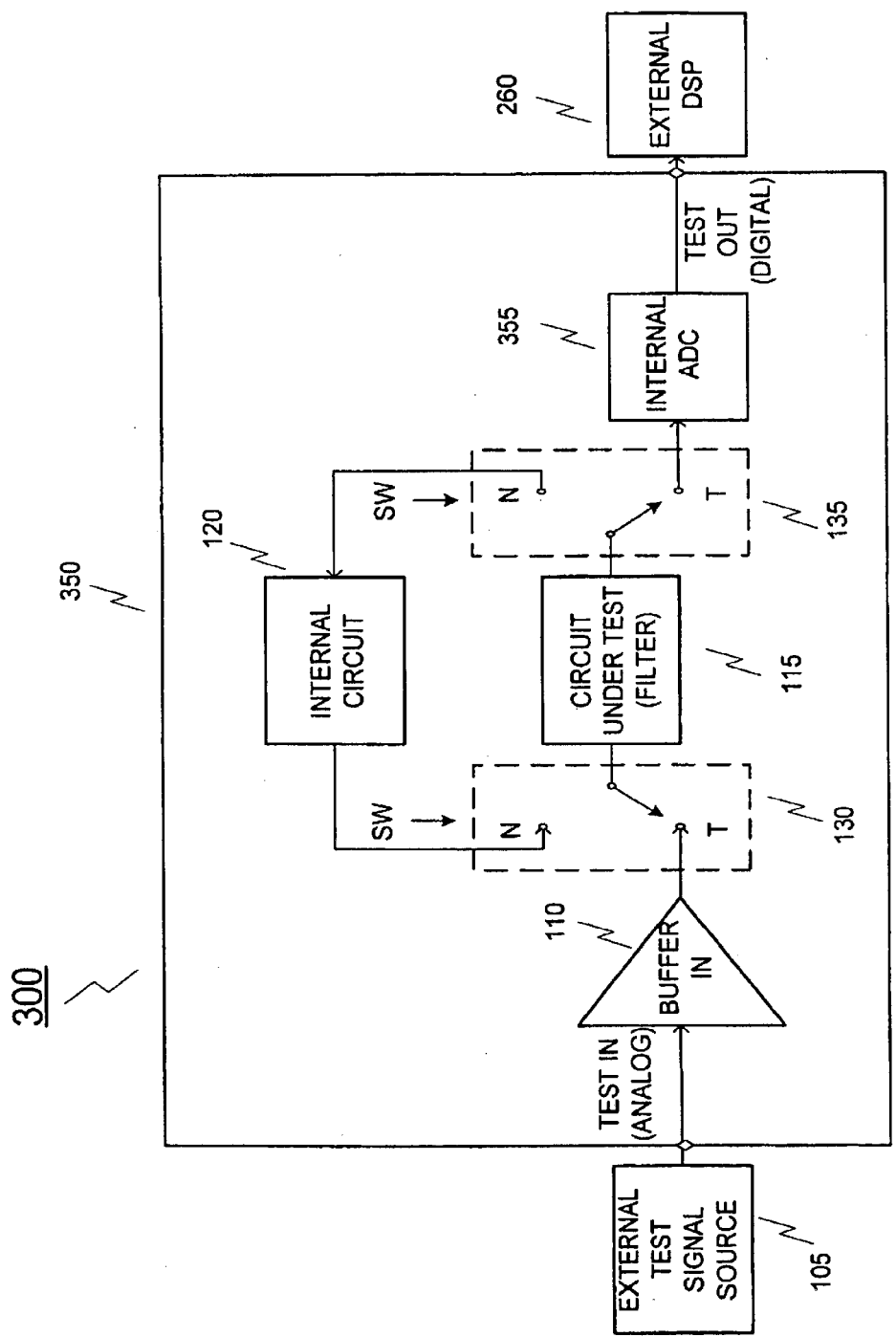
FIG. 3 is a block diagram showing a conventional circuit for testing an integrated filter, including an external test signal source, an internal ADC for testing, and an external DSP-based analyzer.
Figure 4:
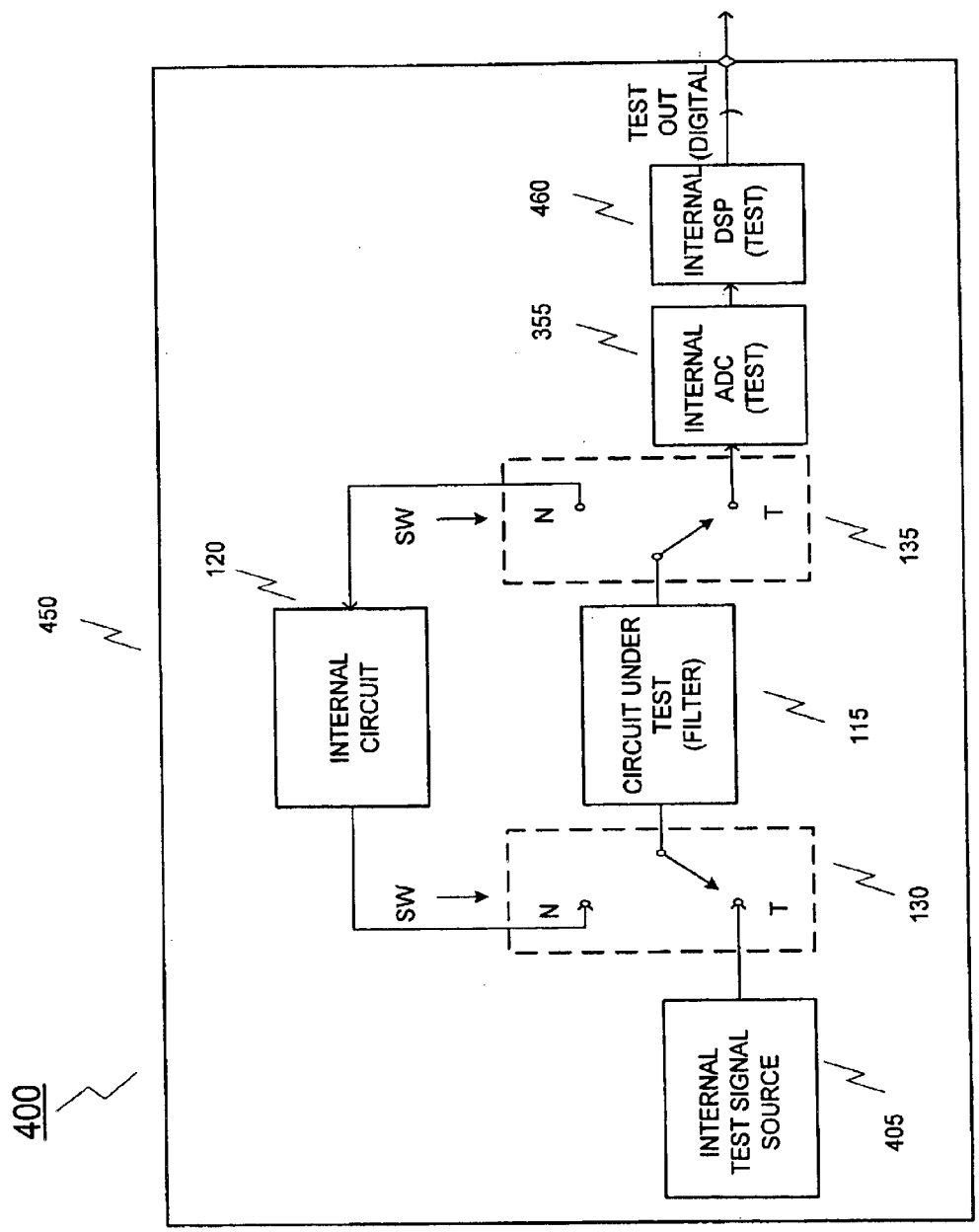
FIG. 4 is a block diagram showing a conventional circuit for testing an integrated filter, including an internal test signal source, an internal ADC for testing, and an internal DSP-based analyzer.
Figure 5:
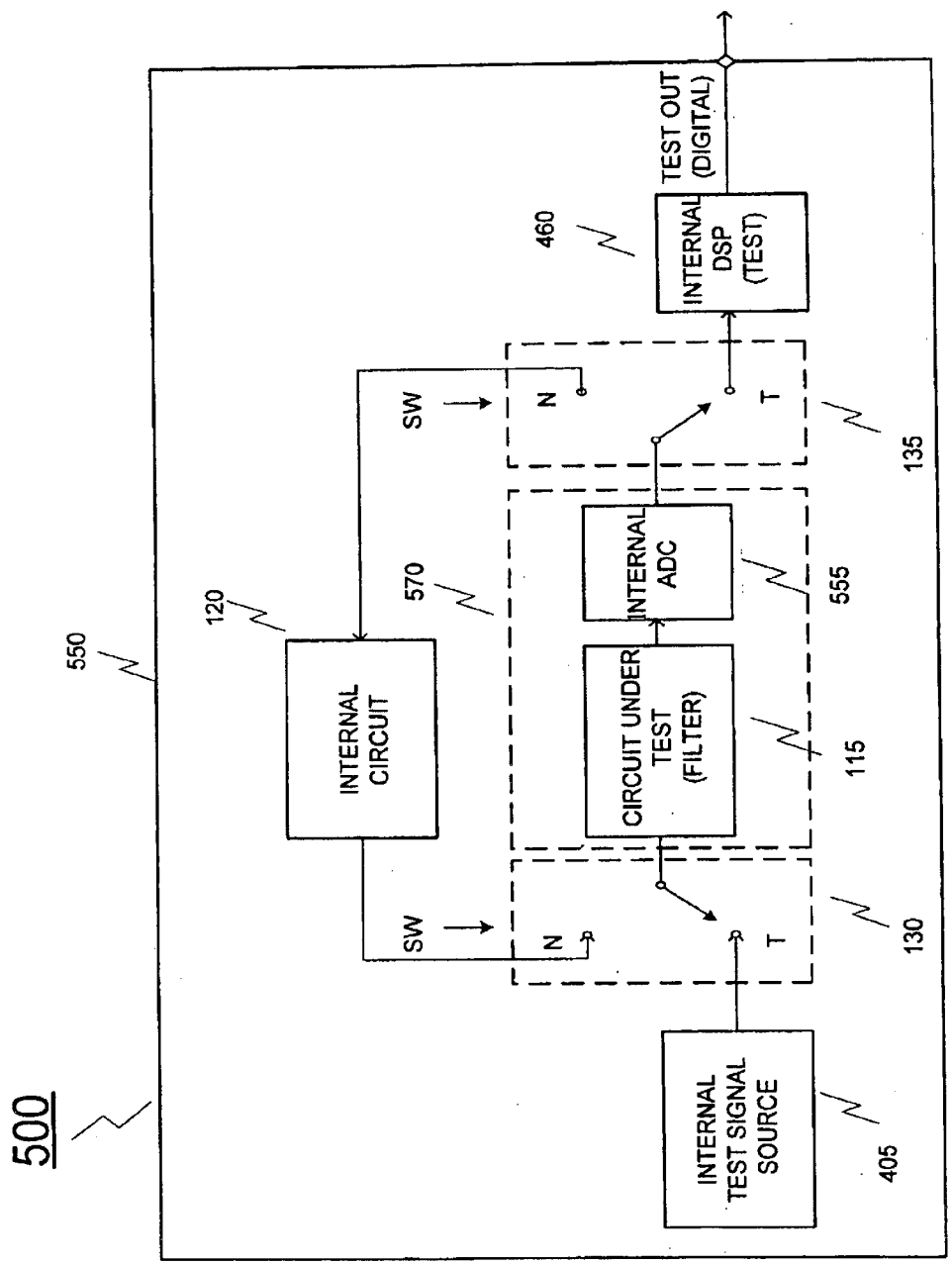
FIG. 5 is a block diagram showing a conventional circuit for testing an integrated filter, including an internal test signal source, an ADC as part of a main circuit, and an internal DSP-based analyzer.
Figure 14:
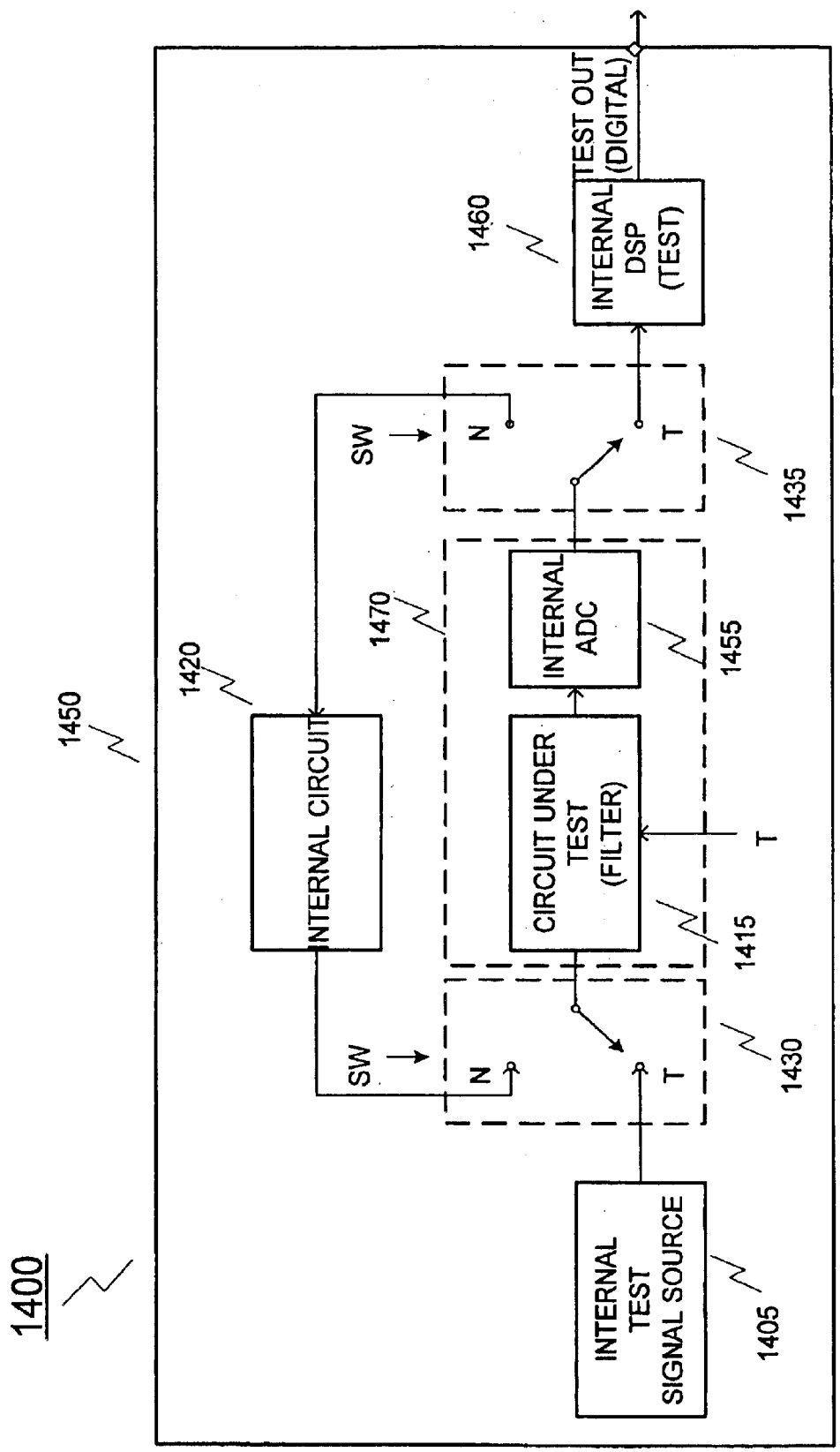
FIG. 14 is a block diagram showing a circuit for testing an integrated filter using CSGMACs in the test mode.

In an alternate embodiment, a filter provided with the test facility can be included in a configuration similar to that shown in FIG. 5. FIG. 14 is a block diagram showing a circuit for testing an integrated filter using CSGMACs in the test mode, according to another embodiment of the present invention. FIG. 14 illustrates a testing circuit 1400 configured similarly to the circuit of FIG. 5, with similar circuit elements including an internal test signal source 1405, an internal circuit 1420, first and second switches 1430 and 1435, an internal analog-to-digital converter (ADC) 1455 and an internal digital signal processor (DSP) 1460, all formed on a semiconductor chip 1450. Testing circuit 1400 of FIG. 14 additionally includes circuit under test (CUT) 1415 having a test signal input T, that replaces CUT 115 of FIG. 5. In FIG. 14, CUT 1415 and internal ADC 1455 are part of main circuit 1470.

In the testing circuit 1400 of FIG. 14, the internal ADC 1455 is part of the main circuit 1470, and operates with the CUT 1415 during a normal operation mode. In other words, when the switch signal SW indicates a normal mode (i.e., connecting the switches 1430 and 1435 to the normal nodes N), the internal circuit 1420 is connected to both the ADC 1455 and the CUT 1415, allowing the internal circuit 1420 to use the ADC 1455 during normal operation.

In FIG. 14, test signal T is internally generated on the chip 1450. As noted above, ADC 1455 is part of the main circuit 1470 and is used for test purposes as well as normal operation. In the normal mode of operation, the CUT 1415 and the ADC 1455 are connected to the internal circuit 1420. In the test mode, the CUT 1415 is connected to the internal test signal source 1405, the output of the ADC 1455 is provided to the DSP 1460, and the CUT 1415 is switched to the test mode (i.e., undergoes transconductance scaling) by activating the test signal T input.

At low frequencies, required test signals can easily be generated on the chip 1450, mostly by digital means, and the output of CUT 1415 can be digitized by an existing on-chip ADC, or by low complexity dedicated low frequency measuring devices. As a result, low-frequency checking of the filter 1415 enables an adequate evaluation of the correctness of the relative sizes of the capacitors, as well as the relative sizes of the transconductors. In the test/tuning mode only the transconductances are scaled. As a result, the effect of the parasitic capacitances (e.g., junction capacitances, wires etc.) in parallel with the frequency setting capacitances can be accurately estimated.

Figure 15:
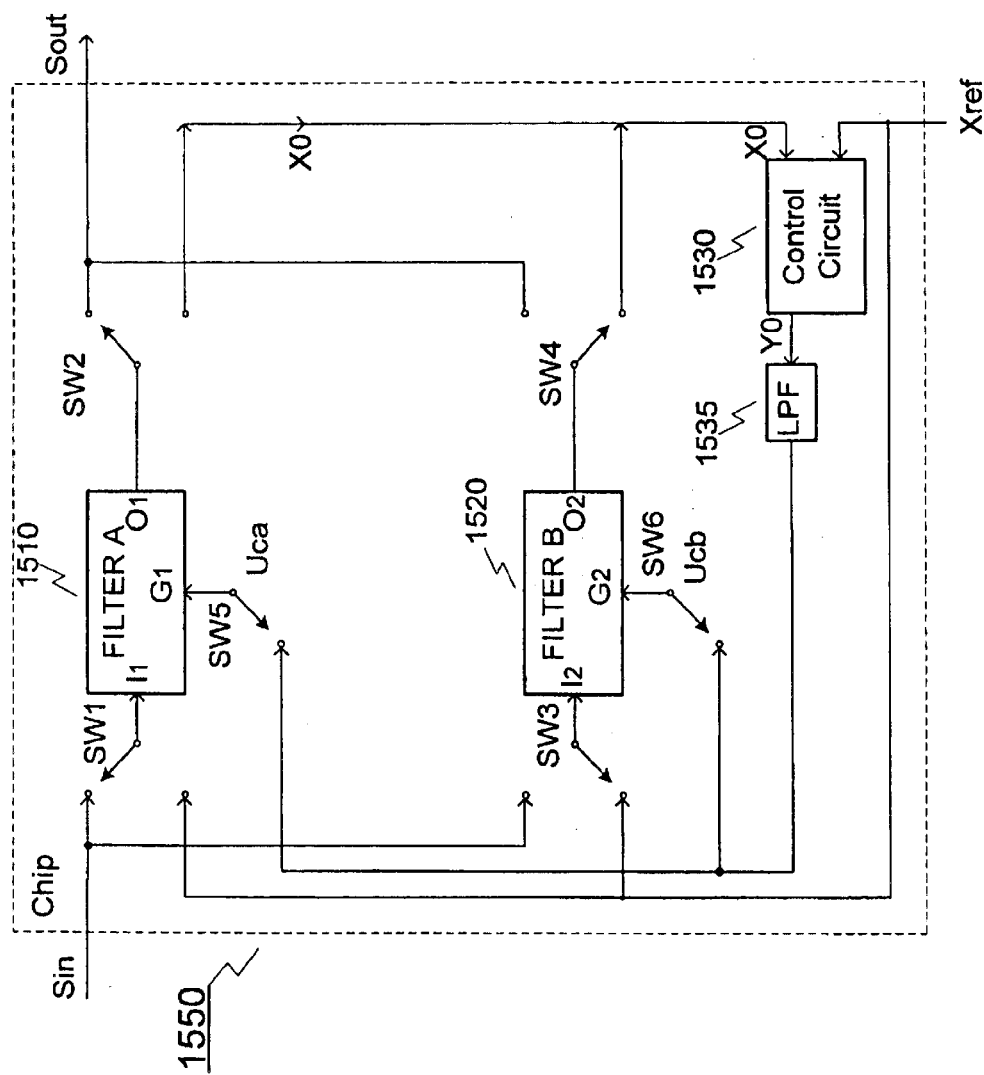
FIG. 15 is a block diagram showing a circuit for a standard direct on-chip closed-loop tuning subsystem.

One of the conventional tuning methods is the direct on-chip closed loop approach, disclosed in FIG. 15. As shown in FIG. 15, a chip 1550 includes two identical filters 1510 and 1520 that are alternatively switched into the normal operation path and into the tuning loop. When the first filter 1510 is switched into the normal path by switches SW1 and SW2 in the positions as shown in FIG. 15, the second filter 1520 is connected to a tuning loop including control circuit 1530 and low-pass filter (LPF) 1535 by way of switches SW3, SW4 and SW6 in the positions as shown.

That is, in the configuration as illustrated in FIG. 15, the first filter 1510 is provided with signal $S_{in}$ via switch SW1 as a first signal input I1, and outputs a first signal output O1 via switch Sw2 as $S_{out}$. Switch SW5 as illustrated is in an open position, the first filter 1510 having been tuned when previously switched into the tuning loop by a first transconductance tuning input G1 provided from control circuit 1530 via LPF 1535 and switch SW5 in a closed position.

The second filter 1520 is provided with a second signal input I2 via switch SW3, and outputs a second signal output O2 via switch SW4. Second filter 1520 as switched into the tuning loop, is tuned with a second transconductance tuning input G2 provided from control circuit 1530 via LPF 1535 and switch SW6.

In greater detail, in FIG. 15 a reference signal Xref with an accurate and stable frequency is applied to the control circuit 1530 and to second filter 1520 in the tuning loop, when the switches are manipulated as illustrated. The response of second filter 1520 to the signal Xref is a signal X0 which is compared to Xref by the control circuit 1530. The result of the comparison is a tuning signal Y0 which is low-pass filtered by LPF 1535. The output of the low-pass filter 1535 is signal Uc used to control the transconductance of the transconductors of the filter to be tuned. While the first filter 1510 is in the normal operation path and the second filter 1520 is being tuned, the signal Uc is applied to the transconductance tuning input G2 of the second filter 1520 via switch SW6, until the convergence of the control signal Uc is achieved. After the control signal Uc has settled, its value is stored by the filter 1520 and the signal input I2 of the second filter 1520 is switched via switch SW3 to the input signal Sin. After the second filter 1520 has settled, the first filter 1510 is taken out of operation, the signal output O2 of the second filter 1520 is connected via switch SW4 to the output Sout and the first filter 1510 enters the tuning phase.

Accordingly, as described above, after tuning of the second filter 1520, the set of tuning parameters for the second filter 1520 are stored by control circuit 1530. Subsequently, switches SW1–SW6 are manipulated into positions opposite as shown in FIG. 15, so that second filter 1520 is switched into the normal path for normal operation, and first filter 1510 is switched into the tuning loop. Incidentally, control circuit 1530 provided control of switches SW1–SW6. In this embodiment, the tuning loop works at the normal operating frequency of the filter. However, the measuring technique according to the present invention can be used to operate the tuning loop at a lower frequency, with the advantage of having fewer critical high-frequency tuning blocks and fewer high-frequency signals active on a given chip.

Figure 16:
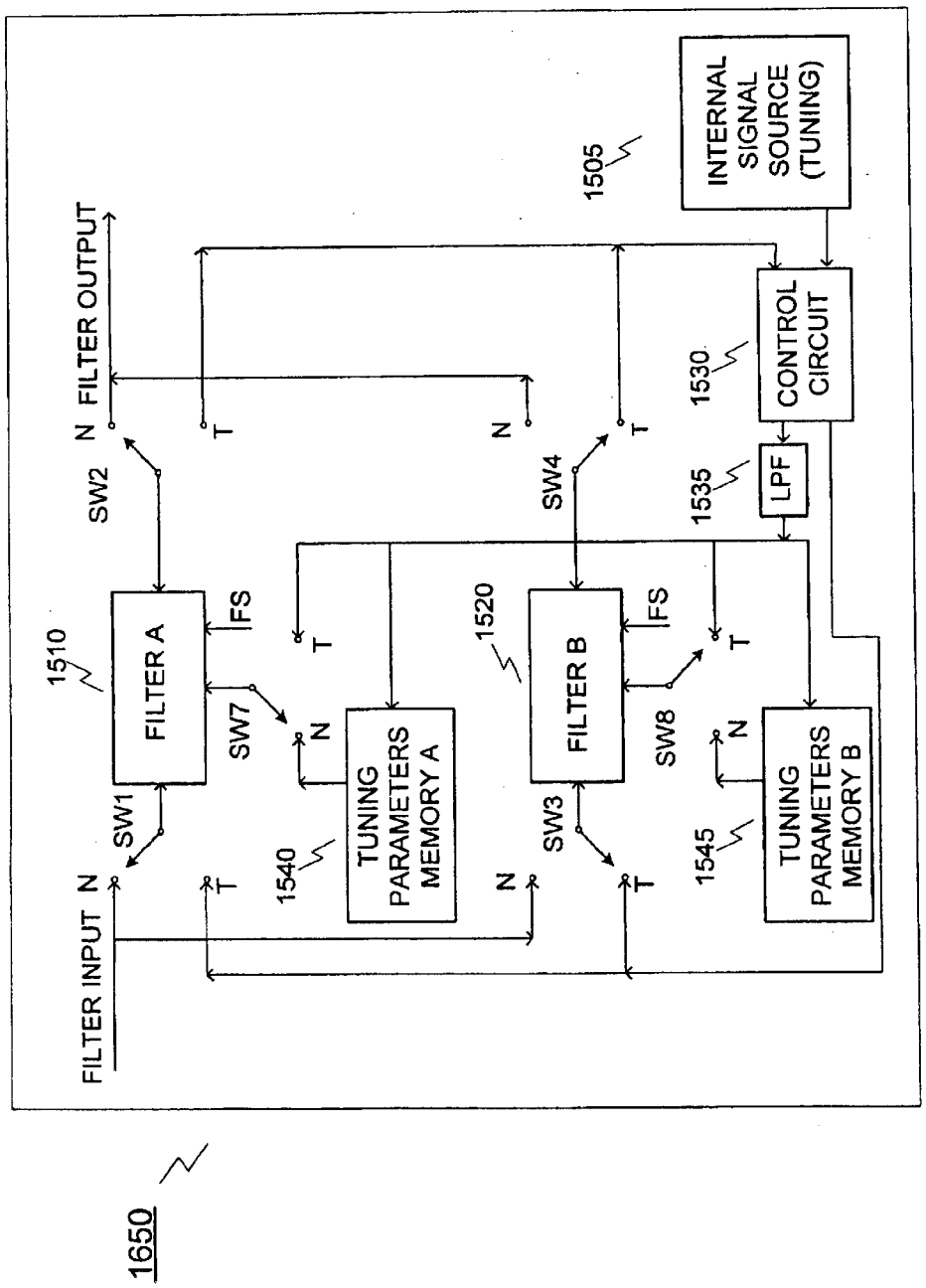
FIG. 16 is a block diagram showing a circuit for a direct on-chip closed-loop tuning subsystem using CSGMACs in the tuning mode.

The chip 1650 of FIG. 16 is configured somewhat similar to that of FIG. 15, as including filters 1510 and 1520 which may use CSGMACs as described with respect to FIG. 13B for example, switches SW1–SW4, low-pass filter (LPF) 1535 and control circuit 1530. Chip 1650 additionally includes switch SW7 that connects filter 1510 to tuning parameters memory 1540 during normal operation mode and to LPF 1535 during tuning operation mode. Similarly, switch SW8 connects filter 1520 to tuning parameters memory 1545 during normal operation mode and to LPF 1535 during tuning operation mode. Also, internal signal source 1505 provides a test signal of accurate and stable frequency to control circuit 1530 during tuning operation mode.

Each of the first and second filters 1510 and 1520 has a normal (N) mode of operation, and a tuning (T) mode of operation. The tuning mode is similar to the test/tuning mode described previously. In this mode, the filter frequency response of filters 1510 and 1520 are scaled-down by current dividers therein that are coupled to the outputs of the transconductors within filters 1510 and 1520, under control of signals FS which are provided by control circuit 1530. Incidentally, the test signal is compared to the output of the corresponding one of the first and second filters 1510 and 1520 that is in the tuning mode by control circuit 1530, which provides the result of the comparison as the tuning signal to the corresponding filter via LPF 1535.

As shown in FIG. 16, when first filter 1510 is switched into the normal operation path to be in the normal operation mode N by way of switches SW1 and SW2 as manipulated into the positions as shown, filter scaling within filter 1510 is turned off under control of signal FS and filter 1510 is coupled to memory 1540 by way of switch SW7 in the position as shown contacting node N. At the same time, second filter 1520 is switched into the tuning loop in the tuning operation mode by way of switches SW3 and SW4 as manipulated into the positions as shown, whereby filter scaling within filter 1520 is turned on under control of signal FS and filter 1520 is connected to LPF 1535 by way of switch SW8 in the position as shown contacting node T. Subsequently, filter 1510 is switched into the tuning operation mode with filter scaling on and filter 1520 is switched into the normal operation mode with filter scaling off, by way of switches SW1–SW4, SW7 and SW8 manipulated into positions opposite as shown in FIG. 16 and control signal FS. Incidentally, the test signal generated by internal signal source 1505 is provided directly to the corresponding filter in the tuning mode by way of control circuit 1530.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A transconductance-capacitance integrator comprising:

a plurality of transconductors that provide transconductor currents responsive to respective voltages input to the transconductance-capacitance integrator;

an adder that adds the transconductor currents to provide a transconductor output current;

a current follower that provides an output current responsive to an input current;

a capacitor, coupled to the current follower, that provides an output voltage of the transconductance-capacitance integrator responsive to the output current;

a scaling circuit that scales the transconductor output current by a scaling factor to provide a scaled transconductor output current to the current follower as the input current; and a mode switch that is coupled to the adder, that is operable in a test/tuning operation mode to connect the transconductor output current to the scaling circuit, and that is operable in a normal operation mode to provide the transconductor output current to the current follower as the input current.

2. The transconductance-capacitance integrator of claim 1, wherein each of the plurality of transconductors has a first transconductance when in the normal operation mode and a second transconductance when in the test/tuning operation mode, the second transconductance being different than the first transconductance.

3. The transconductance-capacitance integrator of claim 2, wherein the scaling circuit divides the transconductor output current by the scaling factor so that the plurality of transconductors have the second transconductance.

4. The transconductance-capacitance integrator of claim 1, wherein the scaling circuit comprises a resistive divider that divides the transconductor output current by the scaling factor to provide the scaled transconductor output current.

5. The transconductance-capacitance integrator of claim 1, wherein the scaling circuit scales the transconductor output current down by the scaling factor to provide the scaled transconductor output current.

6. A method of verifying a transfer function of a transconductance-capacitance based filter including a plurality of transconductors that provide a set of transconductor output currents, comprising:

converting the set of transconductor output currents into a first set of output voltages during a normal operation mode of the transconductance-capacitance filter; and scaling the set of transconductor output currents by a scaling factor to provide a second set of scaled output currents and converting the second set of scaled output currents into a second set of output voltages for verifying the transfer function, during a test/tuning operation mode of the transconductance-capacitance filter.

7. The method of verifying a transfer function of claim 6, wherein each of the plurality of transconductors has a first transconductance during the normal operation mode and a second transconductance during the test/tuning operation mode, the second transconductance being different than the first transconductance.

8. The method of verifying a transfer function of claim 6, wherein said scaling comprises resistively dividing the set of transconductor output currents to provide the second set of scaled transconductor output currents.

9. The method of verifying a transfer function of claim 6, wherein said scaling comprises scaling the set of transconductor output currents down to provide the second set of scaled transconductor output currents.

10. The method of verifying a transfer function of claim 6, wherein the set of transconductor output currents are converted into the first set of output voltages and the second set of scaled output currents is converted into the second set of scaled output voltages by a capacitor.

11. A direct on-chip closed loop tuning system comprising:

a first filter having a plurality of first transconductors that provide a first set of transconductor currents responsive to first respective voltages input to the first filter, a first set of adders that add the first set of transconductor currents to provide a first set of transconductor output currents and a first set of scalers that scale the first set of transconductor output currents to provide a scaled first set of transconductor output currents, the first filter being operable in a normal operation mode to output the first set of transconductor output currents and in a test/tuning operation mode to output the scaled first set of transconductor output currents;

a second filter having a plurality of second transconductors that provide a second set of transconductor currents responsive to second respective voltages input to the second filter, a second set of adders that add the second set of transconductor currents to provide a second set of transconductor output currents and a second set of scalers that scale the second set of transconductor output currents to provide a scaled second set of transconductor output currents, the second filter being operable in the normal operation mode to output the second set of transconductor output currents and in the test/tuning operation mode to output the scaled second set of transconductor output currents; and a controller that simultaneously switches one of the first and second filters into the normal operation mode and another of the first and second filters into the test/tuning operation mode.

12. The direct on-chip closed loop tuning system of claim 11, wherein the plurality of first and second transconductors each has a first transconductance when in the normal operation mode and a second transconductance when in the test/tuning operation mode, the second transconductance being different than the first transconductance.

13. The direct on-chip closed loop tuning system of claim 12, wherein the first and second sets of scalers respectively scale the first and second sets of transconductor output currents down by a scaling factor so that the plurality of first and second transconductors have the second transconductance.

14. The direct on-chip closed loop tuning system of claim 11, wherein the first and second sets of scalers each comprise a resistive divider that respectively scales the first and second sets of transconductor output currents down by a scaling factor to provide the scaled first and second sets of transconductor output currents.

15. The direct on-chip closed loop tuning system of claim 11, wherein the first and second sets of scalers respectively scale the first and second sets of transconductor output currents down by a scaling factor to provide the scaled first and second sets of transconductor output currents.

* * * * *